US010775955B2

(12) United States Patent
Bergin et al.

(10) Patent No.: US 10,775,955 B2
(45) Date of Patent: Sep. 15, 2020

(54) APPROACH FOR GENERATING AND EXPLORING A DESIGN SPACE

(71) Applicant: AUTODESK, INC., San Rafael, CA (US)

(72) Inventors: Michael Bergin, El Cerrito, CA (US); Mark Thomas Davis, Mill Valley, CA (US); Erin Marie Bradner, Berkeley, CA (US); Ken Hung, Oakland, CA (US)

(73) Assignee: AUTODESK, INC., San Rafael, CA (US)

( * ) Notice: Subject to any disclaimer, the term of this patent is extended or adjusted under 35 U.S.C. 154(b) by 1105 days.

(21) Appl. No.: 14/951,338

(22) Filed: Nov. 24, 2015

(65) Prior Publication Data

US 2016/0147913 A1    May 26, 2016

Related U.S. Application Data

(60) Provisional application No. 62/084,490, filed on Nov. 25, 2014.

(51) Int. Cl.
*G06F 3/0481* (2013.01)
*G05B 19/4097* (2006.01)
(Continued)

(52) U.S. Cl.
CPC ....... *G06F 3/0481* (2013.01); *G05B 19/4097* (2013.01); *G06F 3/04847* (2013.01);
(Continued)

(58) Field of Classification Search
CPC ...... G05B 19/4097; G05B 2219/32089; G05B 2219/35012; G05B 2219/35021;
(Continued)

(56) References Cited

U.S. PATENT DOCUMENTS

| 5,510,995 A | 4/1996 | Oliver |
| 8,392,160 B2 | 3/2013 | Brincat et al. |

(Continued)

FOREIGN PATENT DOCUMENTS

| CN | 101038599 A | * | 3/2006 | ............. G06F 17/50 |
| JP | 05-081355 A | | 4/1993 | |

OTHER PUBLICATIONS

Arieff, A. 2013. New Forms that Function Better. MIT Technology Review http://www.technologyreview.com/review/517596/new-formsthat-function-better/ pp. 1-10.
(Continued)

*Primary Examiner* — Aniss Chad
(74) *Attorney, Agent, or Firm* — Artegis Law Group, LLP

(57) ABSTRACT

A design application allows an end-user to define an engineering problem, and then synthesizes a spectrum of design options that solve the engineering problem. The design application then generates various tools to allow the end-user to explore that spectrum of design options. The design application allows the end-user to compare various attributes of each design option, and to filter the spectrum of design options based on those attributes. In response to end-user selections of certain design options, the design application identifies other similar design options, and then displays these design options to the end-user.

24 Claims, 18 Drawing Sheets

(51) Int. Cl.
  *G06F 16/44* (2019.01)
  *G06F 30/00* (2020.01)
  *G06F 30/20* (2020.01)
  *G06F 3/0484* (2013.01)
  *G06T 15/10* (2011.01)
  *G06T 19/20* (2011.01)

(52) U.S. Cl.
  CPC .......... *G06F 16/444* (2019.01); *G06F 30/00* (2020.01); *G06F 30/20* (2020.01); *G06T 15/10* (2013.01); *G06T 19/20* (2013.01); *G05B 2219/32089* (2013.01); *G05B 2219/35012* (2013.01); *G05B 2219/35021* (2013.01); *G05B 2219/49301* (2013.01); *Y02P 80/40* (2015.11)

(58) Field of Classification Search
  CPC ......... G05B 2219/49301; G06F 16/444; G06F 17/50; G06F 17/5009; G06F 3/0481; G06F 3/04847; G06F 30/00; G06F 30/20; G06T 15/10; G06T 19/20; Y02P 80/40
  See application file for complete search history.

(56) References Cited

U.S. PATENT DOCUMENTS

| | | | |
|---|---|---|---|
| 8,589,125 | B2 | 11/2013 | Mori et al. |
| 8,666,702 | B2* | 3/2014 | Schell .................. G06F 17/50 345/420 |
| 8,818,769 | B2 | 8/2014 | Trainer et al. |
| 9,785,727 | B1* | 10/2017 | Wilson .................. G06F 17/50 |
| 2003/0210241 | A1* | 11/2003 | Minami .................. G06F 17/50 345/418 |
| 2005/0038821 | A1 | 2/2005 | Wallen et al. |
| 2006/0058985 | A1 | 3/2006 | Arslan et al. |
| 2006/0066609 | A1* | 3/2006 | Iodice .................. G06T 19/20 345/419 |
| 2007/0078634 | A1 | 4/2007 | Krishnapillai |
| 2007/0118243 | A1 | 5/2007 | Schroeder et al. |
| 2008/0222110 | A1 | 9/2008 | Hayashi |
| 2008/0319928 | A1 | 12/2008 | Hashimoto et al. |
| 2009/0306801 | A1 | 12/2009 | Sivak et al. |
| 2013/0170171 | A1 | 7/2013 | Wicker et al. |
| 2013/0233618 | A1 | 9/2013 | Nakano et al. |
| 2014/0108953 | A1 | 4/2014 | Greene et al. |
| 2015/0099059 | A1 | 4/2015 | Harjee et al. |
| 2015/0324489 | A1 | 11/2015 | Onodera |
| 2015/0356207 | A1 | 12/2015 | Reitman et al. |
| 2015/0362898 | A1 | 12/2015 | Potter |

OTHER PUBLICATIONS

Bertini, E., Dell'Aquila, L., & Santucci, G. 2005. "SpringView: cooperation of radviz and parallel coordinates for view optimization and clutter reduction". In Coordinated and Multiple Views in Exploratory Visualization. (8 pages).

Draper, G., Livnat, Y., & Riesenfeld, R. F. 2009. "A survey of radial methods for information visualization". In Visualization and Computer Graphics. pp. 1-45.

Dunne, C. and Shneiderman, B. 2013. "Motif simplification: improving network visualization readability with fan, connector, and clique glyphs". In Proc CHI '13 (14 pages).

Flager, F. and Haymaker, J. 2007. "A Comparison of Multidisciplinary Design, Analysis and Optimization Processes in the Building Construction and Aerospace Industries". In Proc. of the 24th International Conference on Information Technology in Construction. pp. 1-12.

Flager F, Welle B, Bansal P, Soremekun G, Haymaker J. 2009. "Multidisciplinary process integration and design optimization of a classroom building". Journal of Information Technology in Construction, vol. 14. 595-612.

Gerber, D. J., Lin, S.-H., Pan, B. and Solmaz, A. S. 2012. "Design optioneering: multi-disciplinary design optimization through parameterization, domain integration and automation of a genetic algorithm". In Proc. Symposium on Simulation for Architecture and Urban Design, Society for Computer Simulation International. (pp. 23-30).

Graham, M., & Kennedy, J. 2003. "Using curves to enhance parallel coordinate visualisations". In Information Visualization, 2003.

Grossman, T., Matejka, T. and Fitzmaurice, G. 2010. "Chronicle: capture, exploration, and playback of document workflow histories". In Proc UIST '10. (pp. 143-152).

Hauser, H., Ledermann, F., & Doleisch, H. 2002. "Angular brushing of extended parallel coordinates". In Information Visualization, 2002. (4 pages).

Holzer, D., Hough, R. and Burry, M. 2007. "Parametric Design and Structural Optimisation for Early Design Exploration". International, Journal of Architectural Computing, vol. 5, 4. 625-643.

Lunzer, A. and Hornbæk, K. 2008. "Subjunctive interfaces: Extending applications to support parallel setup, viewing and control of alternative scenarios". ACM Transactions on Computer-Human Interaction vol. 14, 4. 1-17.

Maile, T., Fischer, M., Bazjanac, V. 2007. "Building energy performance simulation tools—a life-cycle and Interoperable perspective". Working Paper. Center for Integrated Facility Engineering, Stanford University. (47 pages).

Marks, J., Andalman, B., Beardsley, P. A., Freeman, W., Gibson, S., Hodgins, J., . . . & Shieber, S. 1997. "Design galleries: A general approach to setting parameters for computer graphics and animation". In Proc. of the 24th annual conference on Computer graphics and interactive techniques.

Shah, J., Vergas-Hernandez, N., Smith, S. 2003. "Metrics for measuring ideation effectiveness". Design Studies vol. 24. 111-134.

Shneiderman, B. 1996. "The eyes have it: A task by data type taxonomy for information visualizations". In Proc. of IEEE Symposium on Visual Languages. (pp. 336-343).

Shneiderman, B., Hewett, T., Fischer, G., Jennings, P. 2006. et al. "Creativity Support Tools: Report from a US National Science Foundation Sponsored Workshop". International Journal of Human Computer Interaction, 20, 2. 61-77.

Steed, C. A., Fitzpatrick, P. J., Jankun-Kelly, T. J., Yancey, A. N., & Swan II, J. E. 2009. "An interactive parallel coordinates technique applied to a tropical cyclone climate analysis". Computers & Geosciences. (pp. 1-40).

Strauss, A. and Corbin, J. 1998. "Basics of qualitative research: Techniques and procedures for developing grounded theory". Thousand Oaks, CA: Sage. (133 pages).

Terry, M. Mynatt, E.D., Nakakoji, K, and Yamamoto, Y. 2004. "Variation in element and action: supporting simultaneous development of alternative solutions". In Proc CHI '04 (pp. 711-718).

Thibodeau, T. 2013. "U.S. makes a Top 10 supercomputer available to anyone who can 'boost' America". In www.computerworld.com.

Ward, M. O. 1994. "Xmdvtool: Integrating multiple methods for visualizing multivariate data". In Proc. of the Conference on Visualization. (9 pages).

Ward, M. O. 2002. "A taxonomy of glyph placement strategies for multidimensional data visualization". Information Visualization. (pp. 194-210).

Wegman, E. J. 1990. "Hyperdimensional data analysis using parallel coordinates". Journal of the American Statistical Association. (pp. 664-675).

Wong, P. C., & Bergeron, R. D. 1994. "30 Years of Multidimensional Multivariate Visualization". In Scientific Visualization. (pp. 1-30).

Non-final Office Action for U.S. Appl. No. 14/951,310 dated Jun. 7, 2018, 21 pages.

Non-Final Office Action received in U.S. Appl. No. 14/951,297, dated Dec. 9, 2019, 30 pages.

Final Office Action received in U.S. Appl. No. 14/951,310, dated Dec. 12, 2019, 39 pages.

Final Office Action received in U.S. Appl. No. 14/951,349, dated Oct. 24, 2019, 23 pages.

(56) References Cited

OTHER PUBLICATIONS

Non-Final Office Action received in U.S. Appl. No. 14/951,366, dated Nov. 12, 2019, 23 pages.
Final Office Action received for U.S. Appl. No. 14/951,297, dated Apr. 22, 2020, 17 pages.

* cited by examiner

APPROACH FOR GENERATING AND EXPLORING A DESIGN SPACE

CROSS-REFERENCE TO RELATED APPLICATIONS

This application claims the benefit of United States provisional patent application titled "Dreamcatcher: Approaches for Design Variation," filed on Nov. 25, 2014 and having Ser. No. 62/084,490. The subject matter of this related application is hereby incorporated herein by reference.

BACKGROUND OF THE INVENTION

Field of the Invention

Embodiments of the present invention relate generally to engineering design and, more specifically, to an approach for generating and exploring a design space.

Description of the Related Art

In a typical engineering workflow, an engineer uses a computer-aided design (CAD) tool to generate three-dimensional (3D) geometry that solves a design problem. In doing so, the engineer typically makes design choices in accordance with a set of design criteria. For example, in the design of an airplane wing, one design objective could be that the airplane wing must provide at least a minimum amount of lift. One design constraint could be that the airplane wing must not be subjected to greater than a maximum amount of stress in a given direction. In order to best meet the design criteria, an engineer oftentimes creates multiple design options that may or may not meet the design criteria. Then, the engineer manually analyzes and compares those different design options to determine which option best fits the design criteria.

One drawback of the above approach is that conventional CAD tools allow engineers to consider only one design option at a time. Thus, engineers using such tools typically have difficulty analyzing and comparing similar design options. Among other things, with conventional CAD tools, an engineer has to toggle or switch back and forth between similar design options, making nuanced differences between those design options difficult to detect and/or determine.

As the foregoing illustrates, what is needed in the art is a more effective approach for analyzing and comparing design options in an engineering workflow.

SUMMARY OF THE INVENTION

Various embodiments of the present invention sets forth a non-transitory computer-readable medium storing instructions that, when executed by a processor, cause the processor to generate design options for comparison, by performing the steps of generating a spectrum of design options, where each design option included in the spectrum of design options is associated with a first attribute, generating a design comparison plot that includes a first axis corresponding to the first attribute, determining a first distance along the first axis based on a first attribute value associated with a first design option included in the spectrum of design options, and displaying the first design option on the design comparison plot at the first distance along the first axis in conjunction with displaying at least one other design option on the design comparison plot.

At least one advantage of the disclosed techniques is that an end-user can evaluate the entire spectrum of design options and narrow that spectrum until only a handful of feasible design options remain. Thus, the end-user need not generate and evaluate every possible design option independently.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
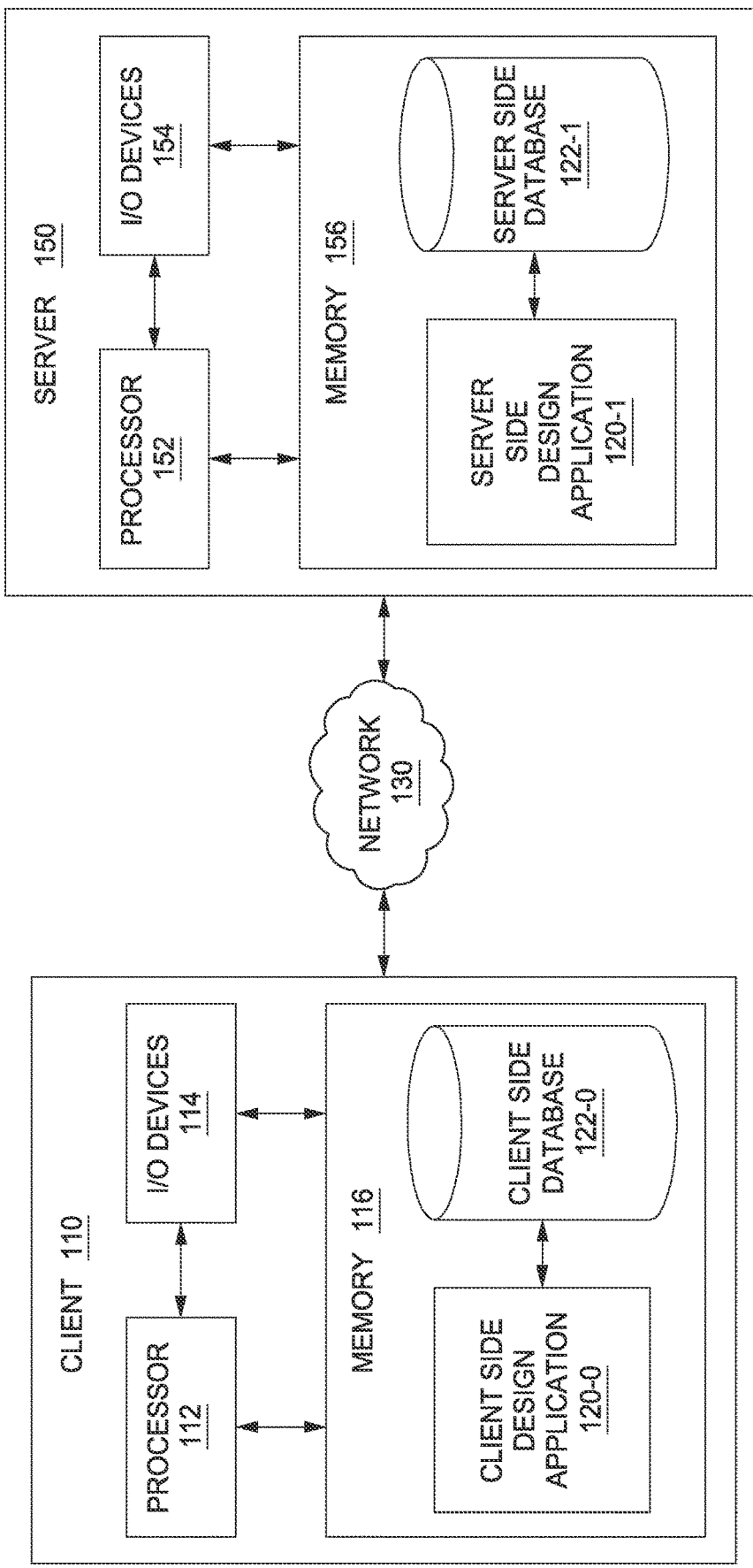
FIG. 1 illustrates a system configured to implement one or more aspects of the present invention.

FIG. 1 illustrates a system 100 configured to implement one or more aspects of the present invention. As shown, system 100 includes, without limitation, a client 110 coupled via a network 130 to a server 150. Client 110 may be any technically feasible variety of client computing device, including a desktop computer, laptop computer, mobile device, and so forth. Network 150 may be any technically feasible set of interconnected communication links, including a local area network (LAN), wide area network (WAN), the World Wide Web, or the Internet, among others. Server 150 may be any technically feasible type of server computing device, including a remote virtualized instance of a computing device, one or more physical cloud-based computing devices, a portion of a datacenter, and so forth.

Client 110 includes processor 112, input/output (I/O) devices 114, and memory 116, coupled together. Processor 112 may be any technically feasible form of processing device configured process data and execute program code. Processor 112 could be, for example, a central processing unit (CPU), a graphics processing unit (GPU), an application-specific integrated circuit (ASIC), a field-programmable gate array (FPGA), and so forth. I/O devices 114 may include devices configured to receive input, including, for example, a keyboard, a mouse, and so forth. I/O devices 114 may also include devices configured to provide output, including, for example, a display device, a speaker, and so forth. I/O devices 114 may further include devices configured to both receive and provide input and output, respectively, including, for example, a touchscreen, a universal serial bus (USB) port, and so forth.

Memory 116 may be any technically feasible storage medium configured to store data and software applications. Memory 116 could be, for example, a hard disk, a random access memory (RAM) module, a read-only memory (ROM), and so forth. Memory 116 includes client-side design application 120-0 and client-side database 122-0. Client-side design application 120-0 is a software application that, when executed by processor 112, causes processor 112 to generate a spectrum of design options and generate a GUI that allows an end-user to explore that spectrum of design options. In doing so, client-side design application 120-0 may store and update data within client-side database 122-0. Such operations may be implemented via computer-aided design (CAD) tools provided by client-side design application 120-0, or via tools provided by other software applications. Client-side design application 120-0 may also interoperate with a corresponding design application that resides within server 150, and access a database that also resides on server 150, as described in greater detail below.

Server 150 includes processor 152, I/O devices 154, and memory 156, coupled together. Processor 152 may be any technically feasible form of processing device configured process data and execute program code, including a CPU, a GPU, an ASIC, an FPGA, and so forth. I/O devices 114 may include devices configured to receive input, devices configured to provide output, and devices configured to both receive and provide input and output.

Memory 156 may be any technically feasible storage medium configured to store data and software applications, including a hard disk, a RAM module, a ROM, and so forth. Memory 156 includes server-side tracking engine 120-1 and server-side design space database 122-1. Server-side design application 120-1 is a software application that, when executed by processor 152, causes processor 152 to generate a spectrum of design options and generate a GUI that allows an end-user to explore that spectrum of design options. In doing so, server-side design application 120-1 may store and update data within server-side database 122-1. Such operations may be implemented via CAD tools provided by server-side design application 120-1 or other types of tools. Server-side design application 120-0 may also interoperate with client-side design application 120-0, and access database 122-0.

In operation, client-side design application 120-0 and server-side design application 120-1 interoperate with one another to implement any and all of the inventive functionality described herein. In doing so, either one or both of client-side design application 120-0 and server-side design application 120-1 may access either one or both of client-side database 122-0 and server-side database 122-1. Generally, client-side design application 120-0 and server-side design application 120-1 represent different portions of single distributed software entity. Thus, for simplicity, client-side design application 120-0 and server-side design application 120-1 will be referred to collectively as design application 120. Similarly, client-side database 122-0 and server-side database 122-1 represent different portions of a single distributed storage entity. Therefore, for simplicity, client-side database 122-0 and server-side database 122-1 will be referred to collectively as database 122. Design application 120 is described in greater detail below in conjunction with FIG. 2.

Figure 2:
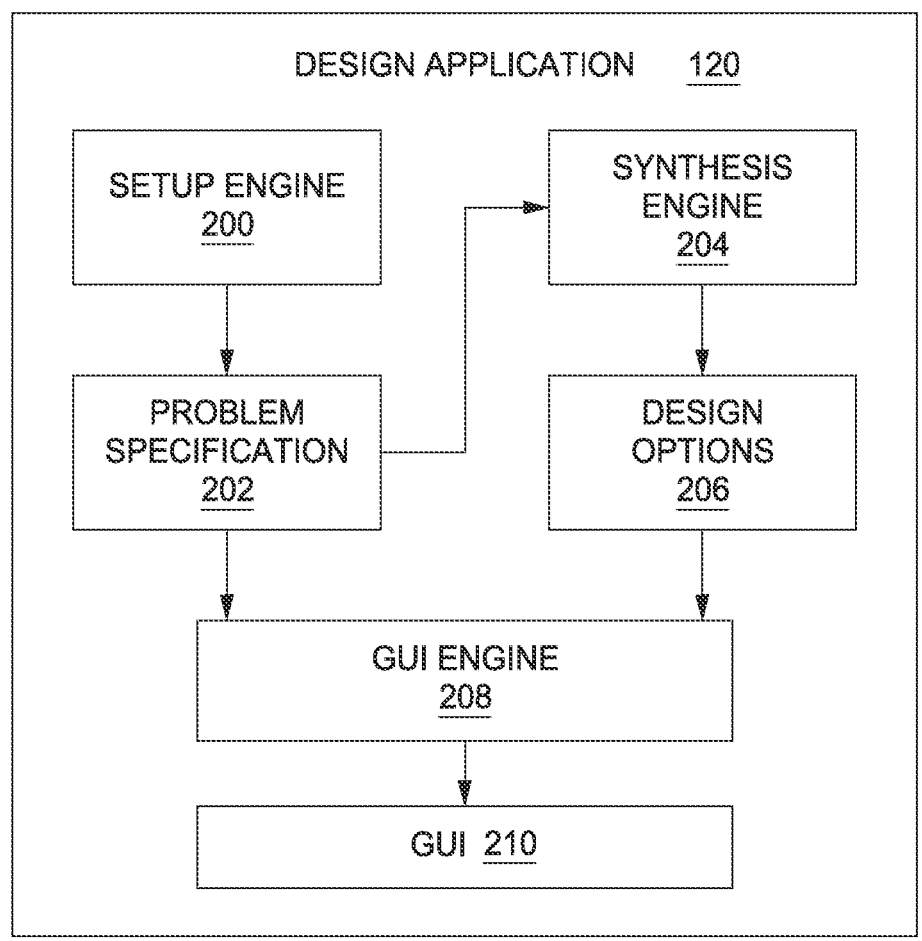
FIG. 2 is a more detailed illustration of the design application of FIG. 1, according to various embodiments of the present invention.

FIG. 2 is a more detailed illustration of the design application of FIG. 1, according to various embodiments of the present invention. As shown, design application 120 includes, without limitation, a setup engine 200, a problem specification 202, a synthesis engine 204, design options 206, a GUI engine 208, and a GUI 210.

Setup engine 200 provides various tools that allow an end-user to define a design problem to be solved. Setup engine 200 generally interoperates with GUI engine 208. An end-user may interact with setup engine 200, via GUI engine 208, to define specific design objectives, design constraints, boundary conditions, and other design criteria that may guide the process of creating design options. Based on interactions with the end-user, setup engine 200 generates problem specification 202.

Problem specification 202 is a data structure that embodies all of the design criteria received via interactions with the end-user. For example, problem specification 202 could reflect a 3D environment that includes specific locations where certain forces are to be supported, within precise volumetric constraints, under particular weight limitations.

Synthesis engine 204 is configured to execute a multi-objective solver, based on problem specification 202, to generate a spectrum of design options that meet the design criteria set forth in that problem specification. In generating a design option 206, synthesis engine 204 generally creates 3D geometry. Synthesis engine 204 may also apply a simulated material to that geometry, thereby allowing physical attributes of the design option to be evaluated, based on the simulated material properties. In one embodiment, synthesis engine 204 may identify various procedures for solving the design problem associated with problem specification 202, and then execute one or more of those procedures to generate a set of feasible design options. Thus, design options 206 may include a wide variety of different types of design options, and potentially a large number of individual design options.

As mentioned above, GUI engine 208 is configured to interoperate with setup engine 200 to facilitate the generation of problem specification 202. In doing so, GUI engine 208 generates and renders GUI 210 to include a 3D environment where design objectives, design constraints, boundary conditions, and other design criteria may be established. FIGS. 3-7, discussed below, set forth screenshots of GUI 210 supporting the generation of problem specification 202.

In addition, GUI engine 208 is configured to generate and render GUI 210 to support the exploration of a design space that includes design options 206. An end-user may interact with GUI 210 in order to quickly analyze tradeoffs between different design options, observe trends in design options, constrain the design space, select specific design options, and so forth. FIGS. 8-16, discussed below, set forth screenshots of GUI 210 providing various tools for analyzing and comparing design options 206.

As a general matter, GUI engine 208 supports any and all operations perform by GUI 210, including managing interactions with end-users, receiving and generating data, rendering portions of GUI 210, receiving end-user input, and so forth.

Figure 3:
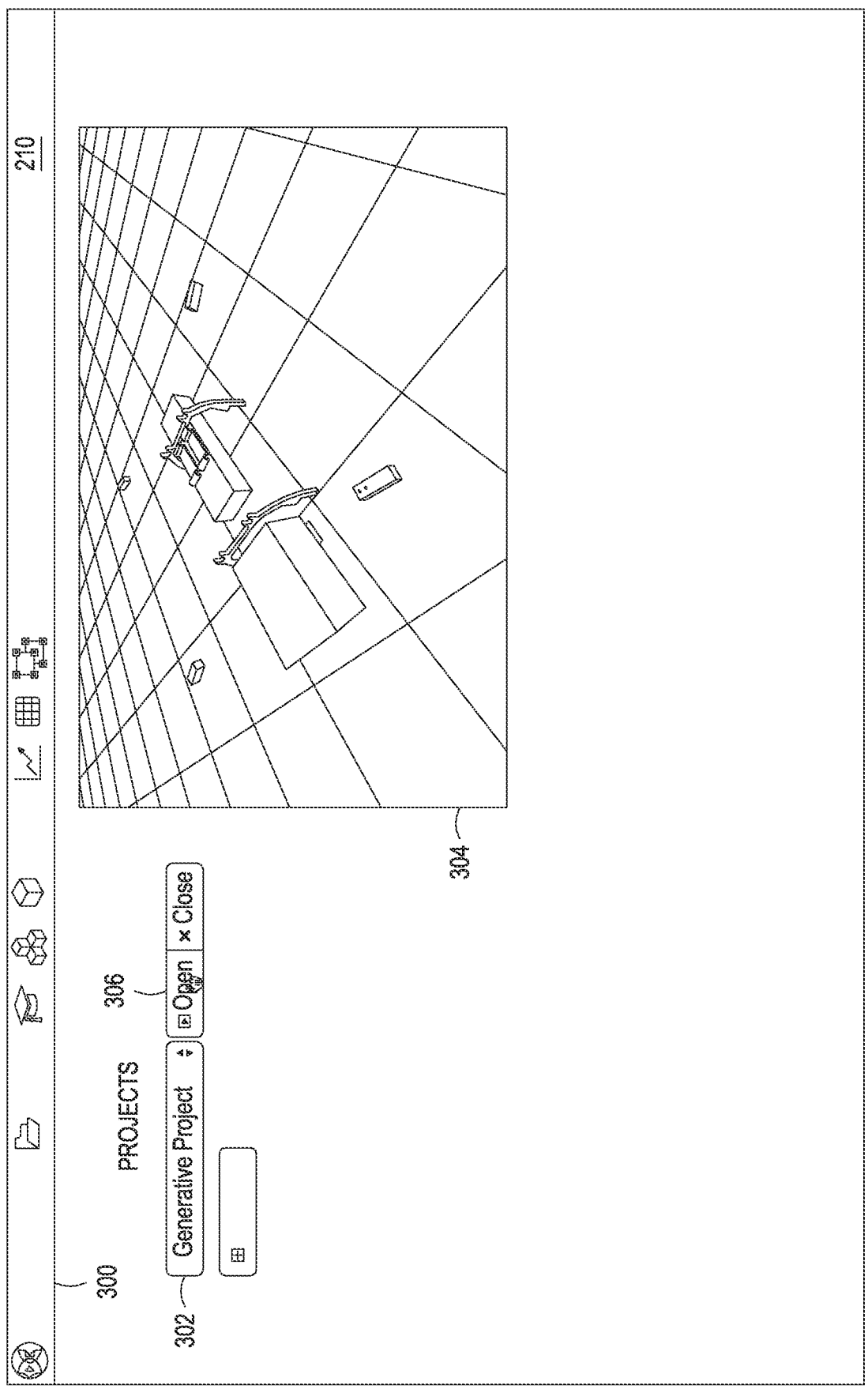
FIG. 3 illustrates how a design space for solving a design problem is launched, according to various embodiments of the present invention.

FIG. 3 illustrates how a design space for solving a design problem is launched, according to various embodiments of the present invention. As shown, GUI 210 includes, without limitation, a menu bar 300, a design space selector 302, a design space 304, and an open button 306. The end-user may select a design space from design space selector 302, and then launch that design space via open button 306. In response, GUI engine 208 retrieves data associated with the design space, and then generates a 3D environment that includes geometry associated with the design space. These operations are described in greater detail below in conjunction with FIG. 4.

Figure 4:
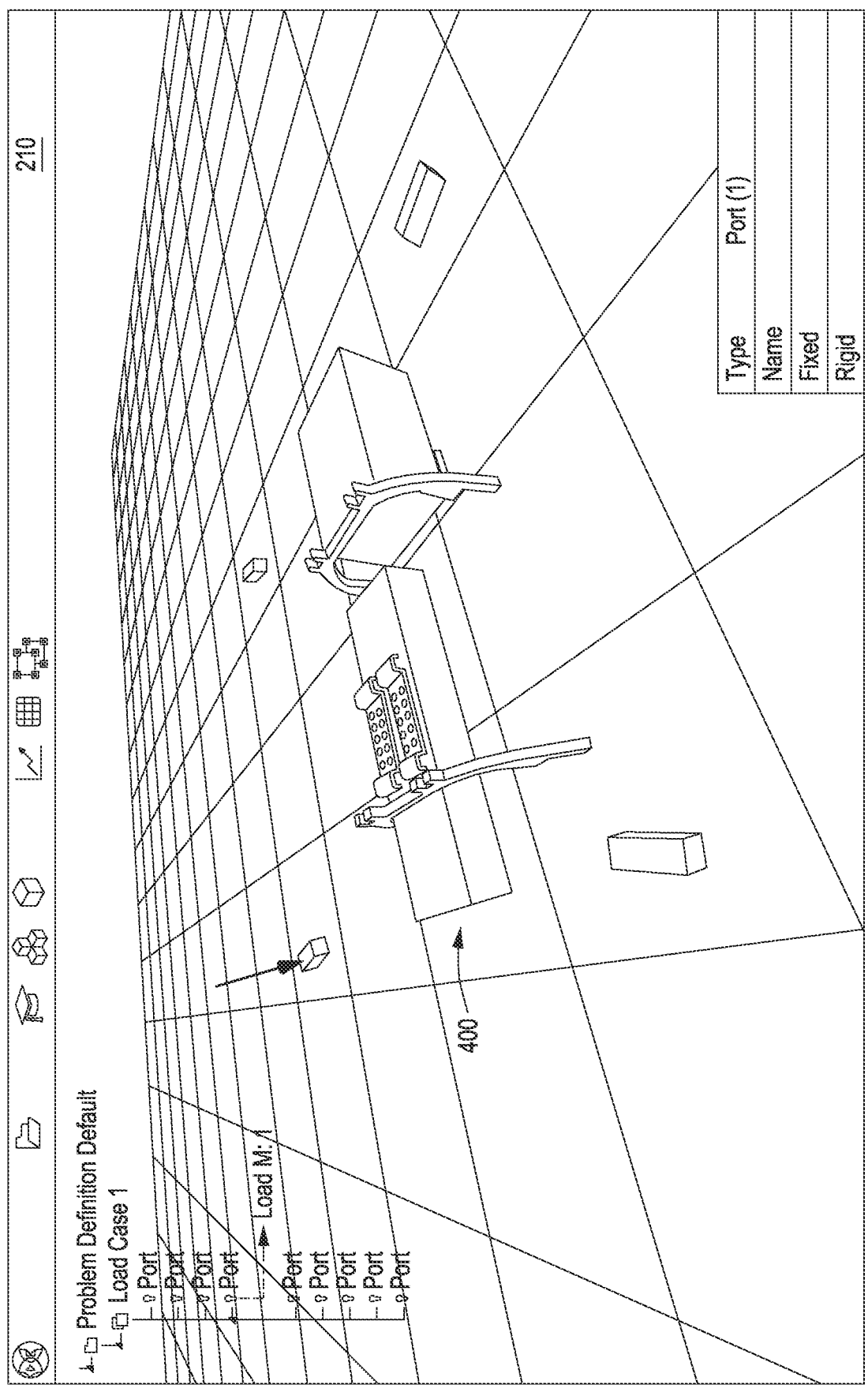
FIG. 4 illustrates one or more boundary conditions being set within the design space of FIG. 3, according to various embodiments of the present invention.

FIG. 4 illustrates one or more boundary conditions being set within the design space of FIG. 3, according to various embodiments of the present invention. As shown, GUI 210 includes, without limitation, geometry 400 associated with a design problem. Geometry 400 may be generated within the 3D environment based on interactions with GUI engine 208 and/or setup engine 200 performed via GUI 210, or geometry 400 may be imported into design application 120 from an external source. Geometry 400 represents various boundary conditions associated with design space 304 that constrain possible design options. The end-user may add various design objectives and design constraints to design space 304 via interactions with GUI 208, as described in greater detail below in conjunction with FIG. 5.

Figure 5:
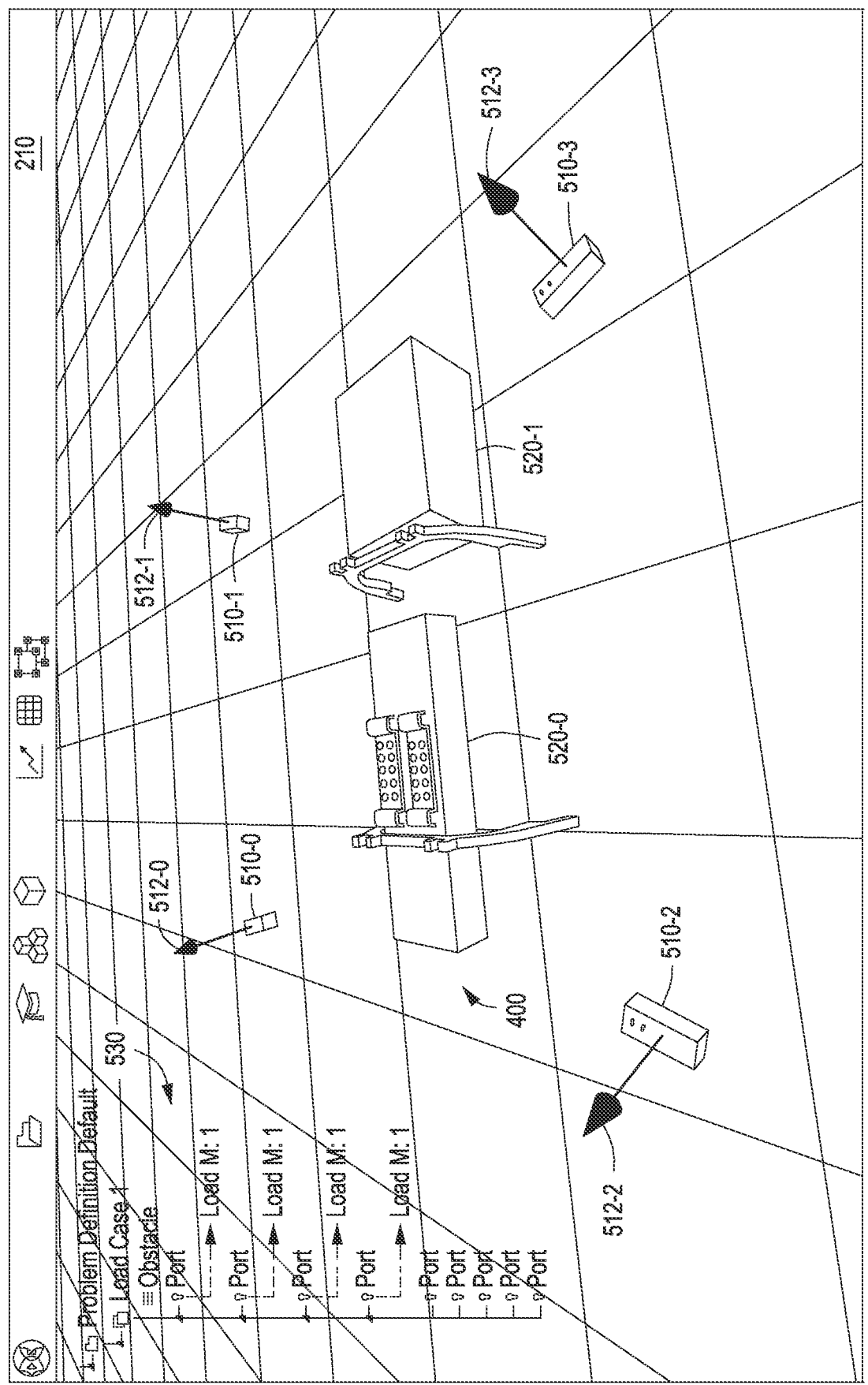
FIG. 5 illustrates design criteria being established for the design problem of FIG. 3, according to various embodiments of the present invention.

FIG. 5 illustrates design criteria being established for the design problem of FIG. 3, according to various embodiments of the present invention. As shown, GUI 210 includes, without limitation, ports 510-0, 510-1, 510-2, 510-3, and 510-4 and corresponding forces 512-0, 512-1, 512-2, and 512-3, obstacles 520-0 and 520-1, and constraint viewer 530.

Ports 510 represent locations within the design space where a potential design should balance forces 512 associated with those ports. For example, port 510-0 represents a location where force 512-0 needs to be balanced by a feasible design option. Thus, ports 510 and forces 512 represent one form of design criteria that should be met by design options 206 generated by synthesis engine 204. Obstacles 520 are 3D volumes where synthesis engine 204 should not create geometry when generating design options 206. Obstacles 520 could represent, for example, areas where other components of the overall design may reside, portions of the ground or other environmental constraints, and so forth. Constraint viewer 530 displays the various ports, forces, and obstacle in hierarchical format for easy viewing. In operation, the end-user interacts with GUI engine 208, via GUI 210, to set locations for ports 510, forces 212 for those ports, and obstacle 520. Then, GUI engine 208 updates GUI 210 to include constraint viewer 530, which displays representations of those ports, forces, and obstacles.

Figure 6:
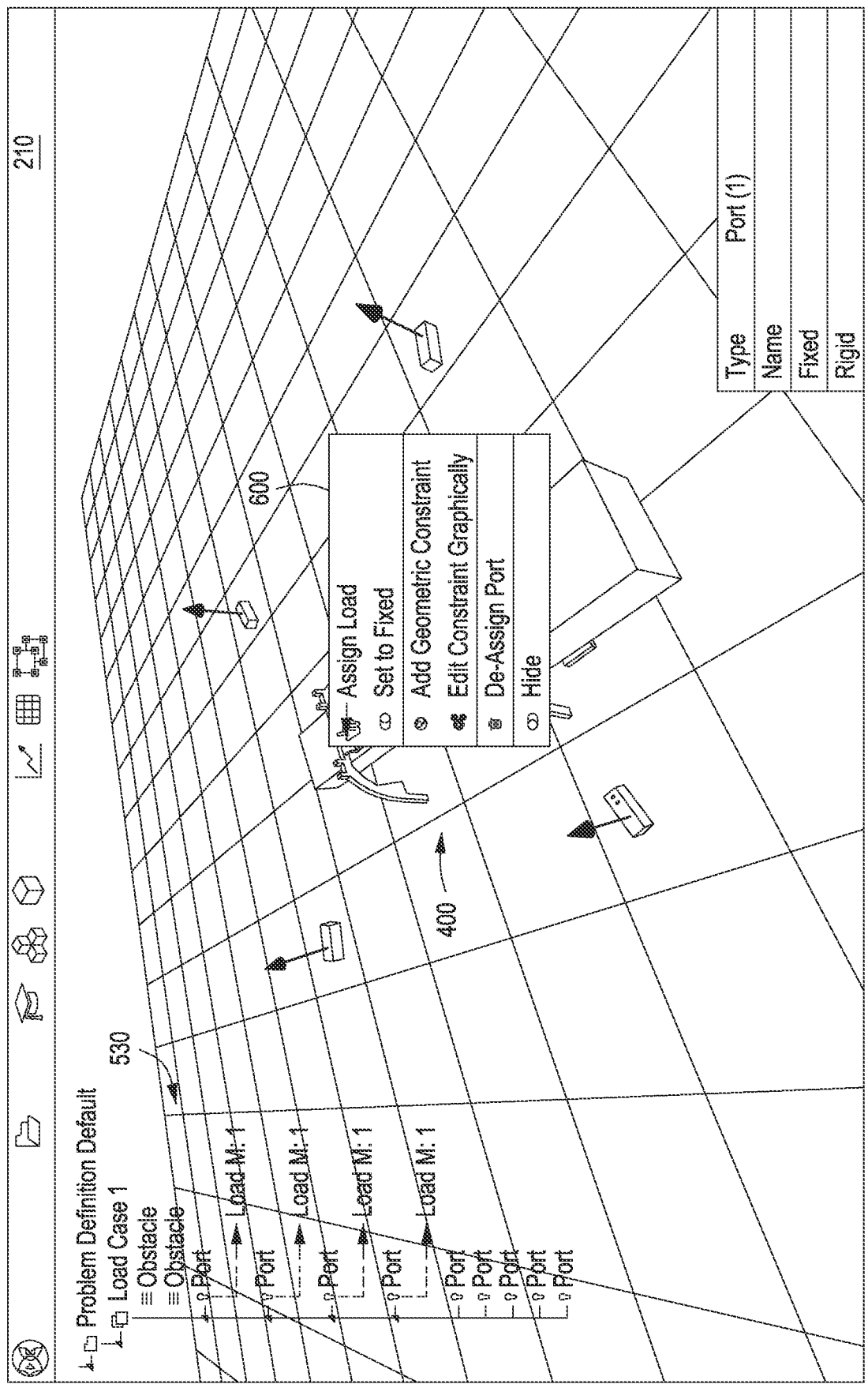
FIG. 6 illustrates additional design criteria being established for the design problem of FIG. 3, according to various embodiments of the present invention.

FIG. 6 illustrates additional design criteria being established for the design problem of FIG. 3, according to various embodiments of the present invention. As shown, GUI 210 includes, without limitation, a constraint menu 600. Constraint menu 600 allows the end-user to constrain portions of geometry 400 by adding loads, set geometry as fixed, apply geometric constraints to geometry, edit geometry, remove ports, or hide portions of geometry altogether. In the example shown, GUI 210 allows the end-user to assign a load to a portion of geometry 400. GUI engine 208 processes the added constraints and then updates GUI 210 to reflect those constraints.

Figure 7:
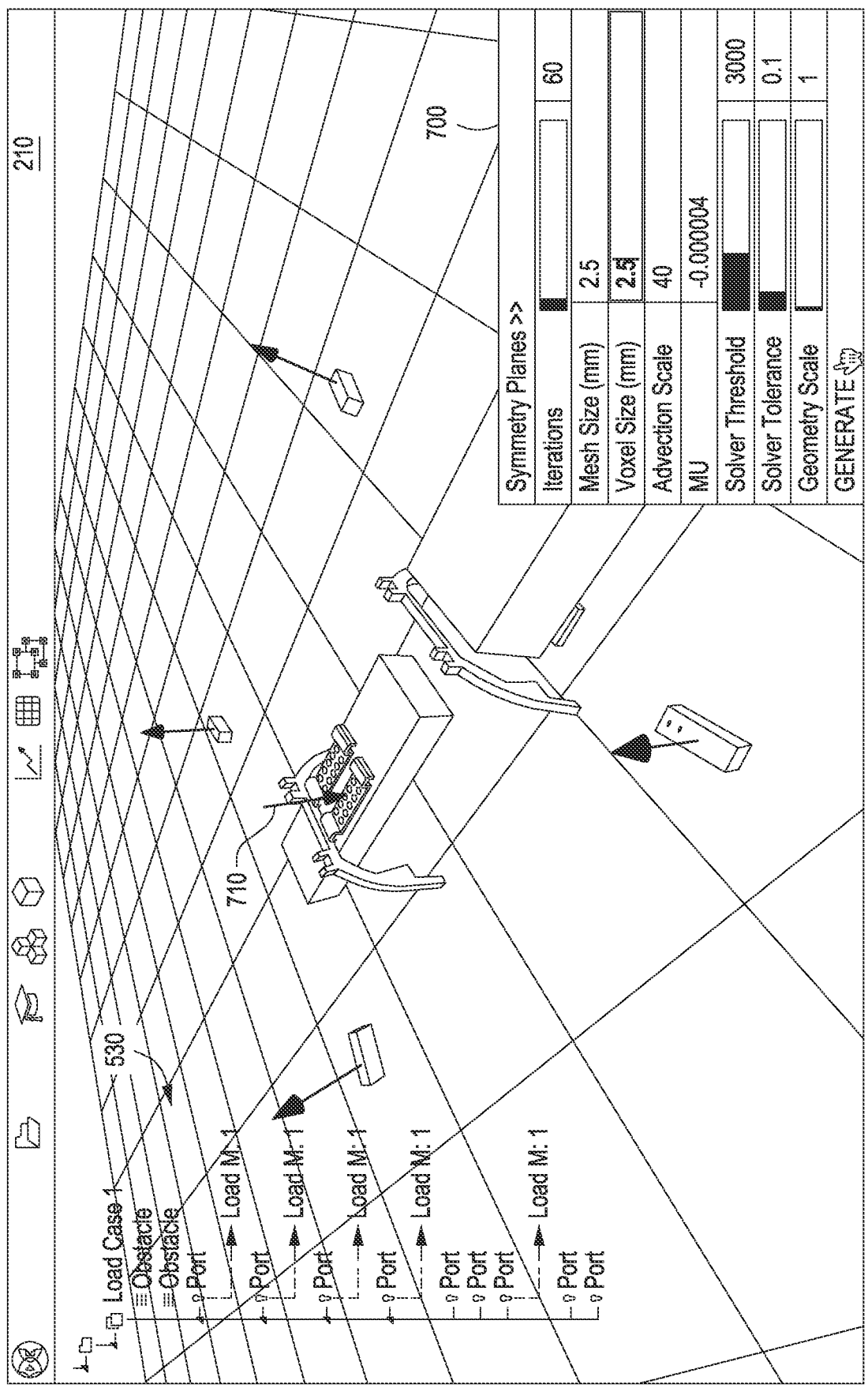
FIG. 7 illustrates the initialization of global parameters for generating design options for the design problem of FIG. 3, according to various embodiments of the present invention.

FIG. 7 illustrates the initialization of global parameters for generating design options for the design problem of FIG. 3, according to various embodiments of the present invention. As show, GUI 210 includes, without limitation, global parameters 700 and load 710. Setup engine 200 adds load 710 in response to input received via constraint menu 600 shown in FIG. 6. Global parameters 700 include various inputs to synthesis engine 204 that control the multi-objective solver executed by synthesis engine 204 when generating design options 206. The end-user may set global parameters 700 in order to limit or relax the overall computational approach implemented by synthesis engine 204. When global parameters 700 are set, synthesis engine 204 may commence generation of design options 206.

Figure 8:
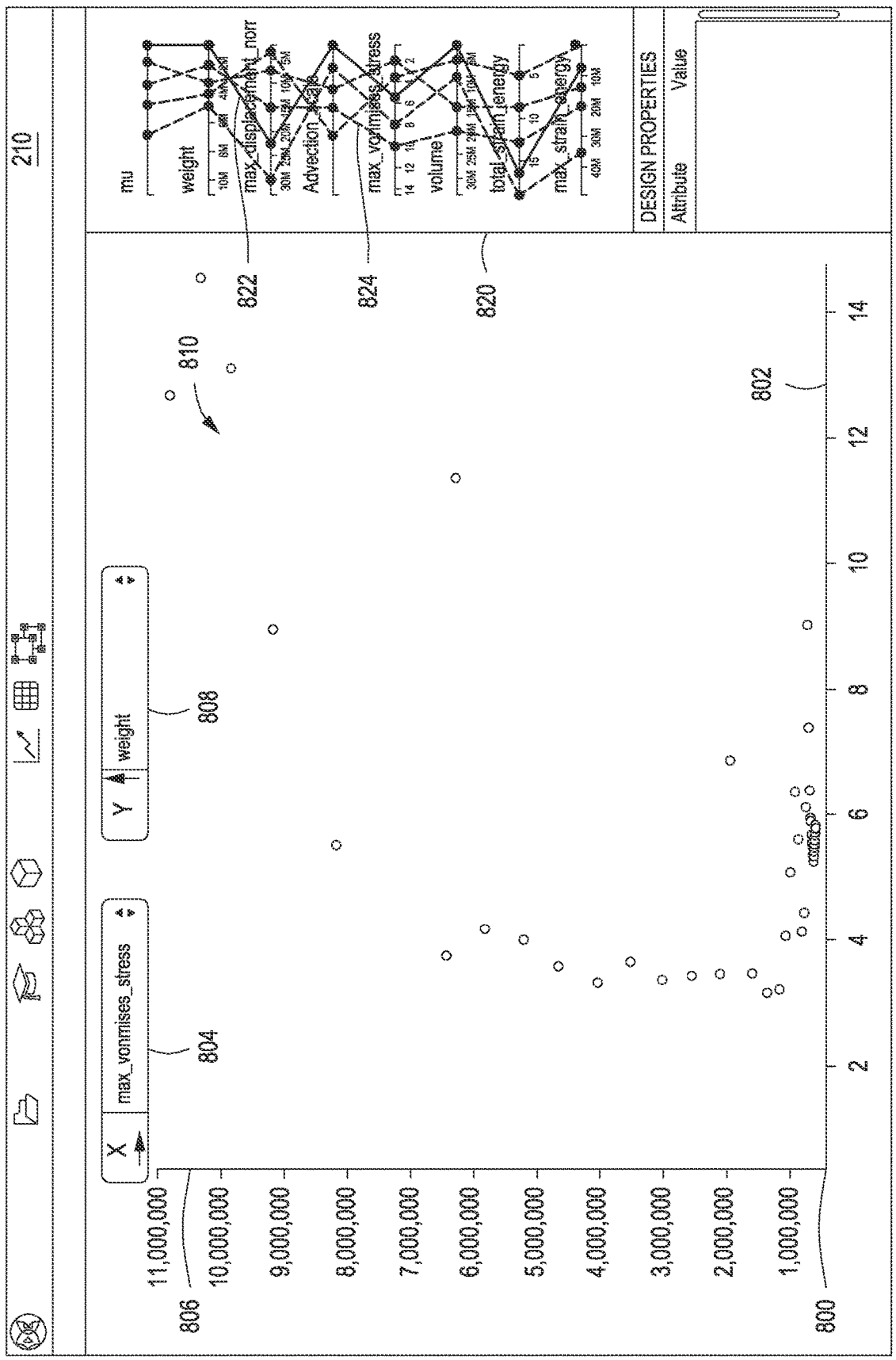
FIG. 8 illustrates a spectrum of design options that solves the design problem of FIG. 3, according to various embodiments of the present invention.

FIG. 8 illustrates a spectrum of design options that solves the design problem of FIG. 3, according to various embodiments of the present invention. As shown, GUI 210 includes, without limitation, a design comparison plot 800 and a multi-attribute controller 820. Design comparison plot 800 includes an X-axis 802, an X-axis attribute selector 804, a Y-axis 806, a Y-axis attribute selector 808, and a spectrum of design options 810. Multi-attribute controller 820 includes a design option hyper-vector 822 and a design option vector 824.

X-axis attribute selector 804 and Y-axis attribute selector 806 are selectors that allow the end-user to select particular attributes to be associated with different axes. Generally, X-axis attribute selector 804 allows the end-user to select an X-axis attribute, and Y-axis attribute selector 808 allows the end-user to select a Y-axis attribute. In the example shown, the X-axis attribute is "maximum von Mises stress," and the Y-axis attribute is "weight." GUI engine 208 is configured to plot each design option 206 in spectrum 810 based on attributes of those design options that correspond to the X-axis attribute and the Y-axis attribute. Specifically, for a given design option 206, GUI engine 208 determines the X and Y-axis attributes of plot 800, and then determines corresponding attributes of the design option 206. Based on the values of those attributes, GUI engine 208 determines an X-Y position for the design option 206 and then updates plot 800 to include that design option at the determined X-Y position. If the end-user selects different X or Y-axis attributes, GUI engine 208 then updates plot 800 accordingly.

Multi-attribute controller 820 is a control element that allows the end-user to adjust spectrum 810 based on attributes of design options 206 within that spectrum. The end-user may select the specific attributes shown in multi-attribute controller 820, and then filter spectrum 820 based on those attributes to remove design options 206 falling outside desired attribute ranges. Multi-attribute controller 820 is described in greater detail below in conjunction with FIGS. 13-14. Multi-attribute controller 820 includes design option hyper-vector 822, as mentioned above.

Design option hyper-vector 822 is a composite of design option vectors associated with some or all design options 206 in spectrum 810. An exemplary design option vector 824 is shown. In the context of this disclosure, a "design option vector" refers to a vector of attribute values associated with a specific design option 206. Those attributes could include, for example, weight, volume, maximum stress, maximum strain, total strain energy, maximum von Mises stress, and other physical attributes of a design. Design option hyper-vector 822 may represent an average of design option vectors, a median design option vector, or other combination of design option vectors.

Figure 9:
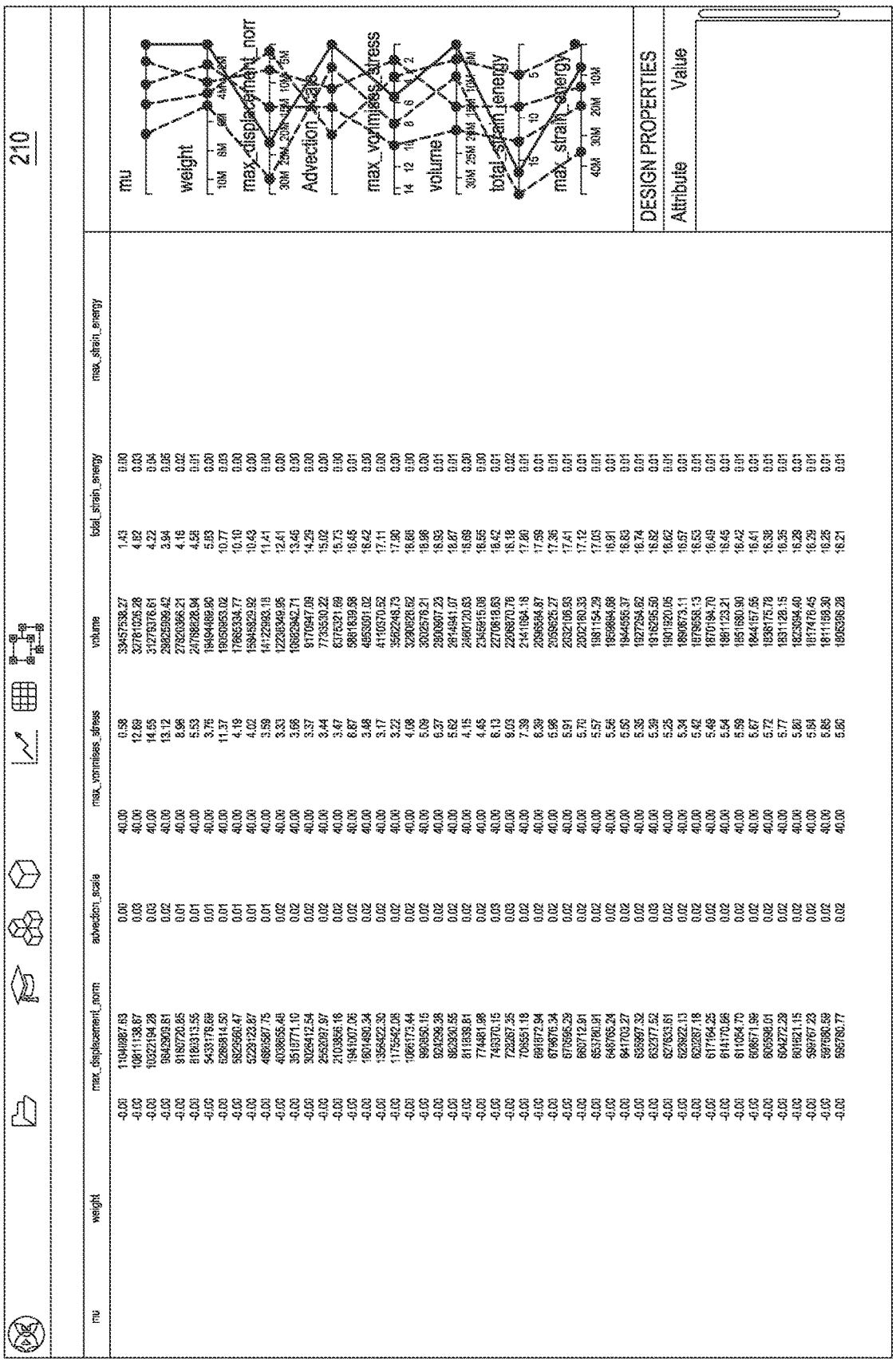
FIG. 9 illustrates a spreadsheet of data associated with the spectrum of design options of FIG. 8, according to various embodiments of the present invention.

FIG. 9 illustrates a spreadsheet of data associated with the spectrum of design options of FIG. 8, according to various embodiments of the present invention. As shown, GUI 210 includes, without limitation, a spreadsheet 900. Spreadsheet 900 includes attribute data for design options 206 within spectrum 810. Spreadsheet 900 may include attribute data associated with the attributes selected for multi-attribute controller, or spreadsheet 900 may include any other attributes associated with design options 206. In addition to spreadsheet 900, GUI engine 208 may generate and include in GUI 210 other types of representative charts as well, including scatterplot charts, line graphs, bar charts, 3D charts, and so forth.

Figure 10:
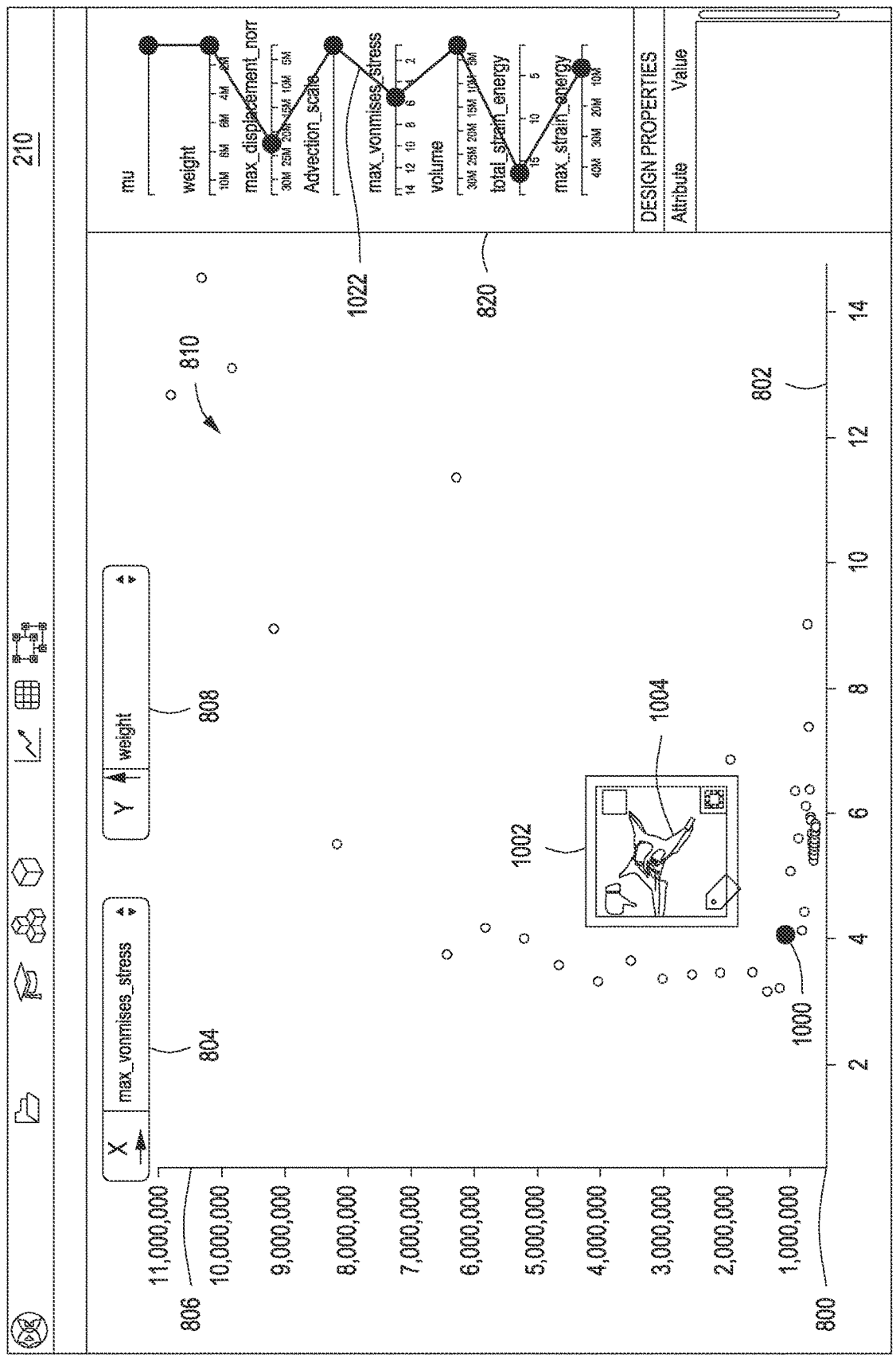
FIG. 10 illustrates design properties associated with a selected design option, according to various embodiments of the present invention.

FIG. 10 illustrates design properties associated with a selected design option, according to various embodiments of the present invention. As shown, GUI 210 includes, without limitation, a design option 1000, a design option popup 1002, a design option preview 1004, and a design option vector 1022. Design option 1000 may be selected from within spectrum 810 shown in FIGS. 8 and 10. When the end-user selects design option 1000, GUI engine 208 retrieves data associated with that design options an updates GUI 210 to include that data. In the example shown, GUI engine 208 causes design option popup 1002 to be displayed, along with design option preview 1004. In addition, GUI engine 208 also causes design option vector 1022 to be displayed. Design option vector 1022 represents a set of attributes associated with design option 1000. GUI engine 210 is configured to also provide a more detailed view of a selected design option, such as design option 1000, as described in greater detail below in conjunction with FIG. 10.

Figure 11:
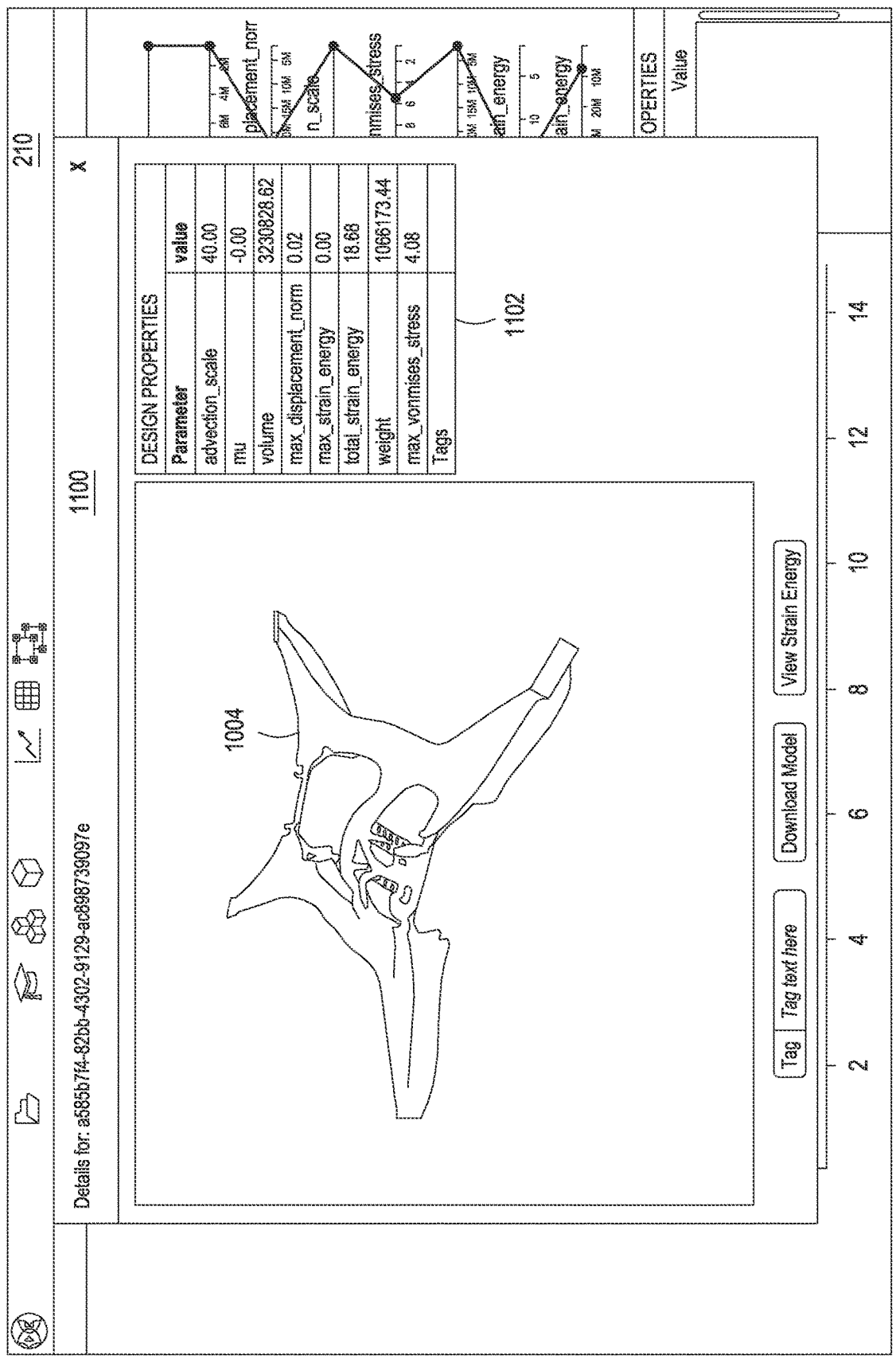
FIG. 11 illustrates a detailed view of the selected design option of FIG. 10, according to various embodiments of the present invention.

FIG. 11 illustrates a detailed view of the selected design option of FIG. 10, according to various embodiments of the present invention. As shown, GUI 210 includes, without limitation, a design detail window 1100 and design properties panel 1102. GUI engine 208 generally displays design option preview 1004 within design detail window 1100 with higher resolution compared to design option popup 1002 shown in FIG. 10. In addition, GUI engine 208 may render design option preview 1004 as a 3D, rotatable model with superimposed metadata including stress, strain, energy, thickness, and other engineering data. Design properties panel 1102 displays various properties of design option 1000, as well as metrics related to the simulation of design option 1000. Based on design option 1000, GUI engine 208 may suggest alternative design options, as described in greater detail below in conjunction with FIG. 11.

Figure 12:
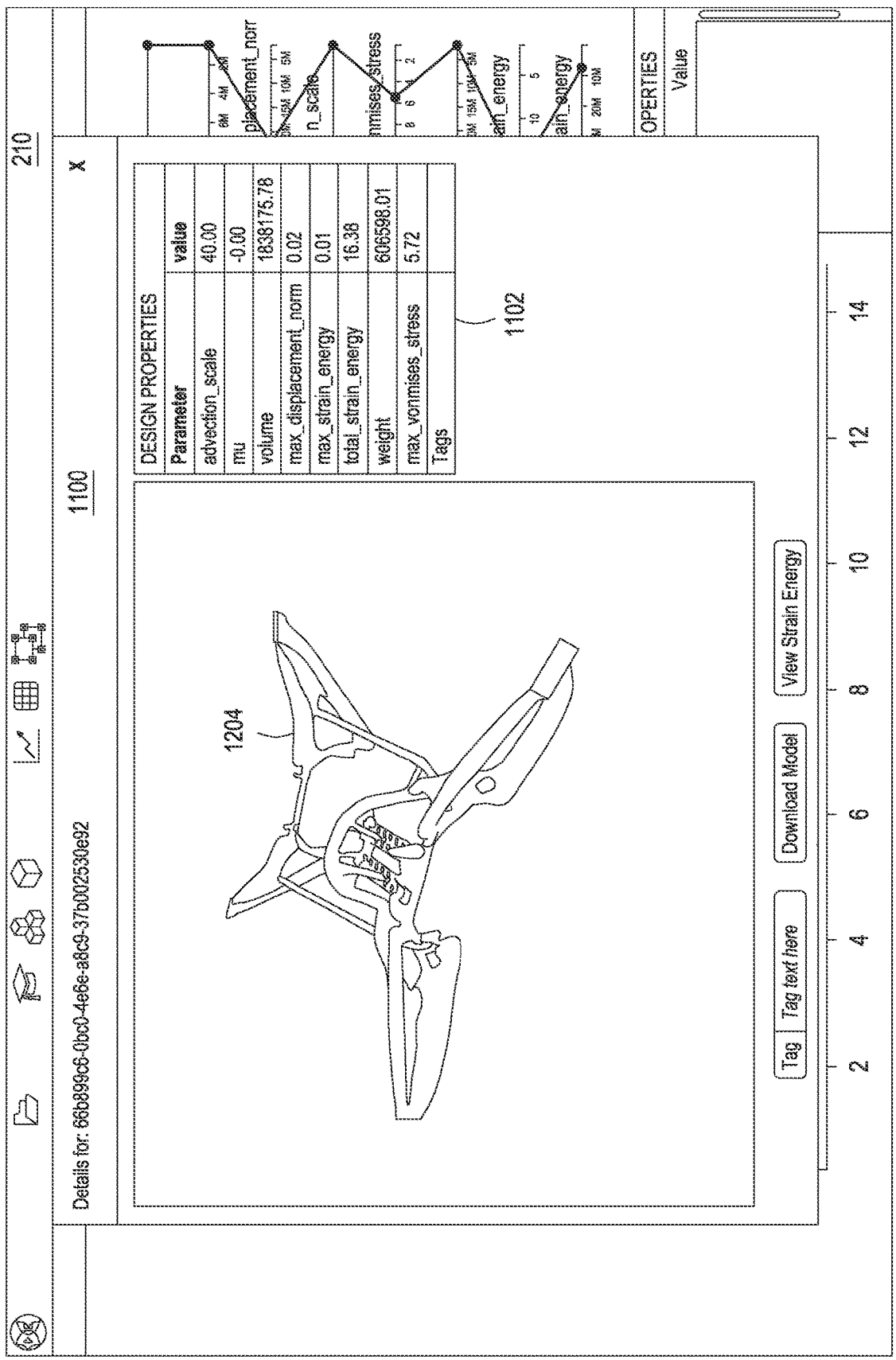
FIG. 12 illustrates a detailed view of a suggested design option derived from the spectrum of design options of FIG. 8, according to various other embodiments of the present invention.

FIG. 12 illustrates a detailed view of a suggested design option derived from the spectrum of design options of FIG. 8, according to various other embodiments of the present invention. As shown, design detail window 1100 now shows a design option preview 1204 of a suggested design. GUI engine 208 may determine the suggested design by analyzing design spectrum 810 and identifying one or more design options 206 that better meet the design criteria than design option 1000. GUI engine 208 may then suggest to the end-user viewing the identified design options in greater detail, along with specific design properties, via design detail window 1100.

Figure 13:
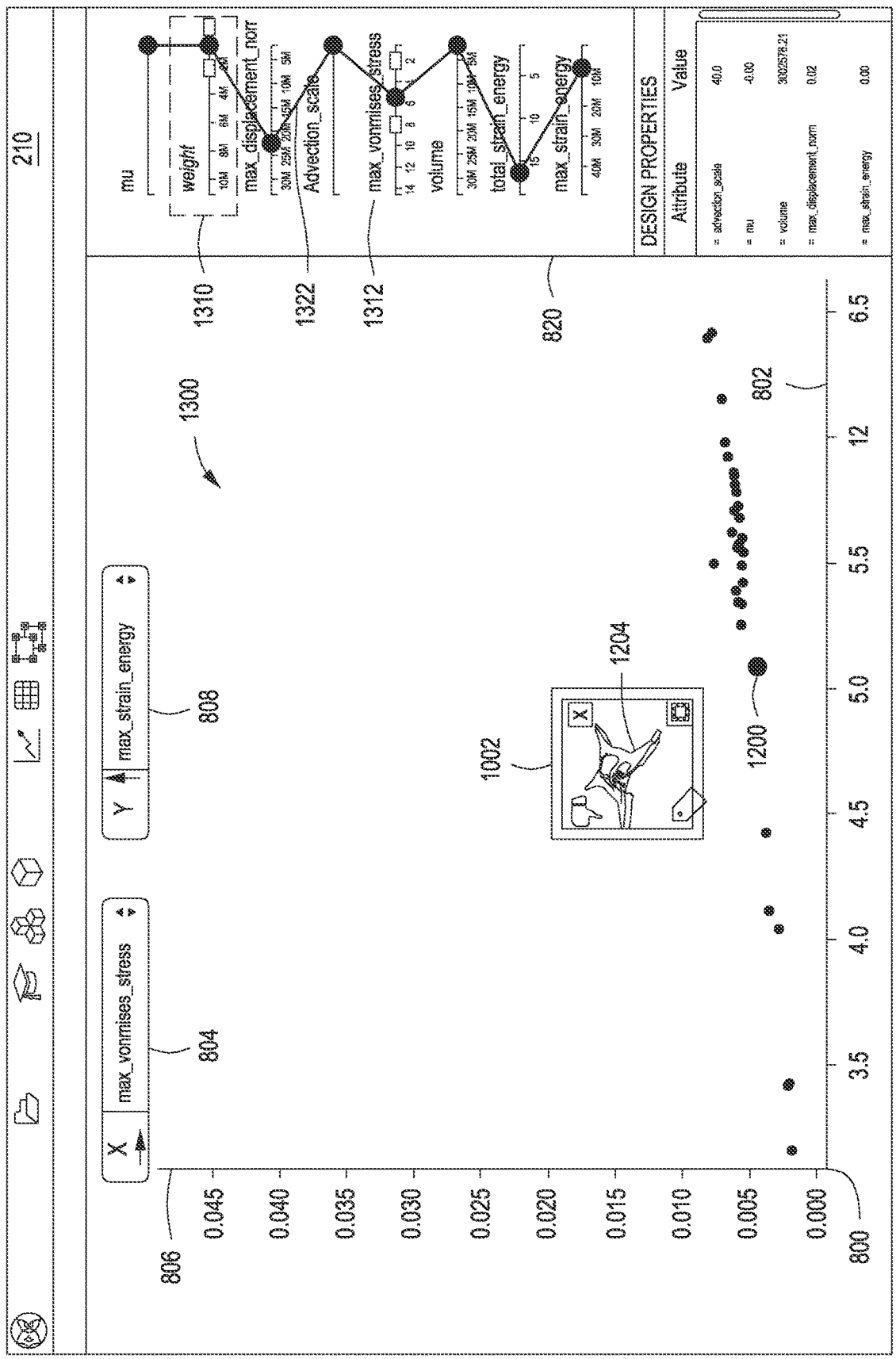
FIG. 13 illustrates how the spectrum of design options of FIG. 8 is narrowed based on one or more attribute filters, according to various embodiments of the present invention.

FIG. 13 illustrates how the spectrum of design options of FIG. 8 is narrowed based on one or more attribute filters, according to various embodiments of the present invention. As shown, GUI 210 includes, without limitation, design option spectrum 1300, including design option 1200 and associated design option preview 1204 rendered in design option popup 1002. Design option vector 1322 corresponds to design option 1200.

Spectrum 1300 represents a subset of spectrum 810 shown in FIGS. 8 and 10. GUI engine 208 narrows spectrum 810 to become spectrum 1300 based on end-user input to multi-attribute controller 1320. In particular, multi-attribute controller 1320 includes attribute sliders 1310 and 1312 that allow the end-user to constrain specific attributes of design options 206. Based on the position of these sliders, GUI engine 208 may hide or show certain design options 206 in spectrum 1300 when plotting plot 800, thereby creating spectrum 1300. In the example shown, GUI engine 208 constrains spectrum 810 to include only those design options 206 having a weight value falling within the range prescribed by attribute slider 1310 and having a maximum von Mises stress falling within the range prescribed by attribute slider 1312, resulting in spectrum 1300. Design vector 824 represents a design option having a maximum von Mises stress that falls outside of the range prescribed by slider 1312. Design vector 824 and the associated design option are thus no longer shown.

Figure 14:
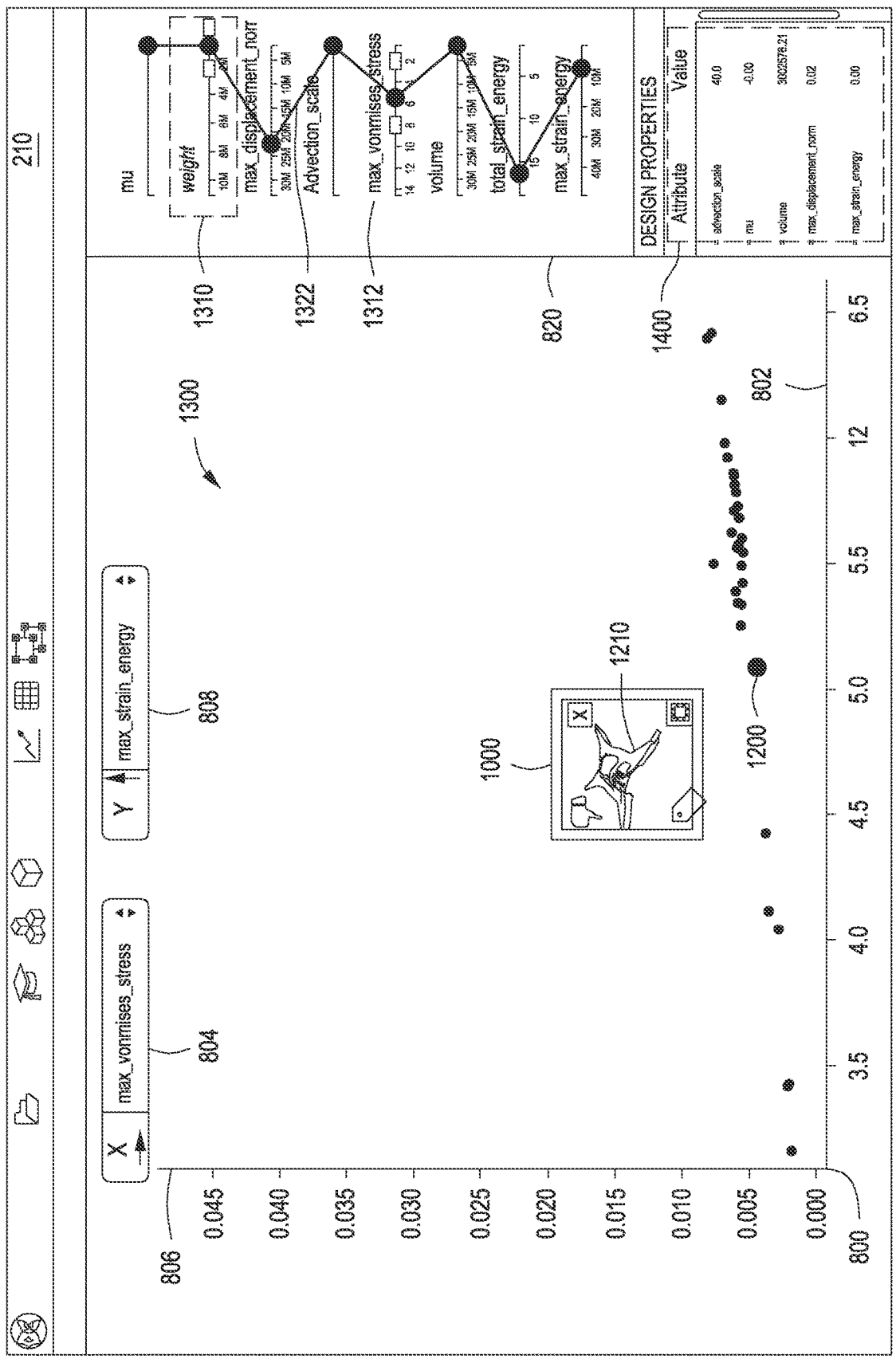
FIG. 14 illustrates design properties of the suggested design option of FIG. 10 shown in conjunction with the spectrum of design options of FIG. 13, according to various embodiments of the present invention.

FIG. 14 illustrates design properties of the suggested design option of FIG. 10 shown in conjunction with the spectrum of design options of FIG. 13, according to various embodiments of the present invention. As shown, GUI 210 includes, without limitation, design properties panel 1400. Generally, when an end-user selects a design option 206, GUI engine 208 displays various metadata associated with that design option, including physical properties and/or simulation metrics.

Figure 15:
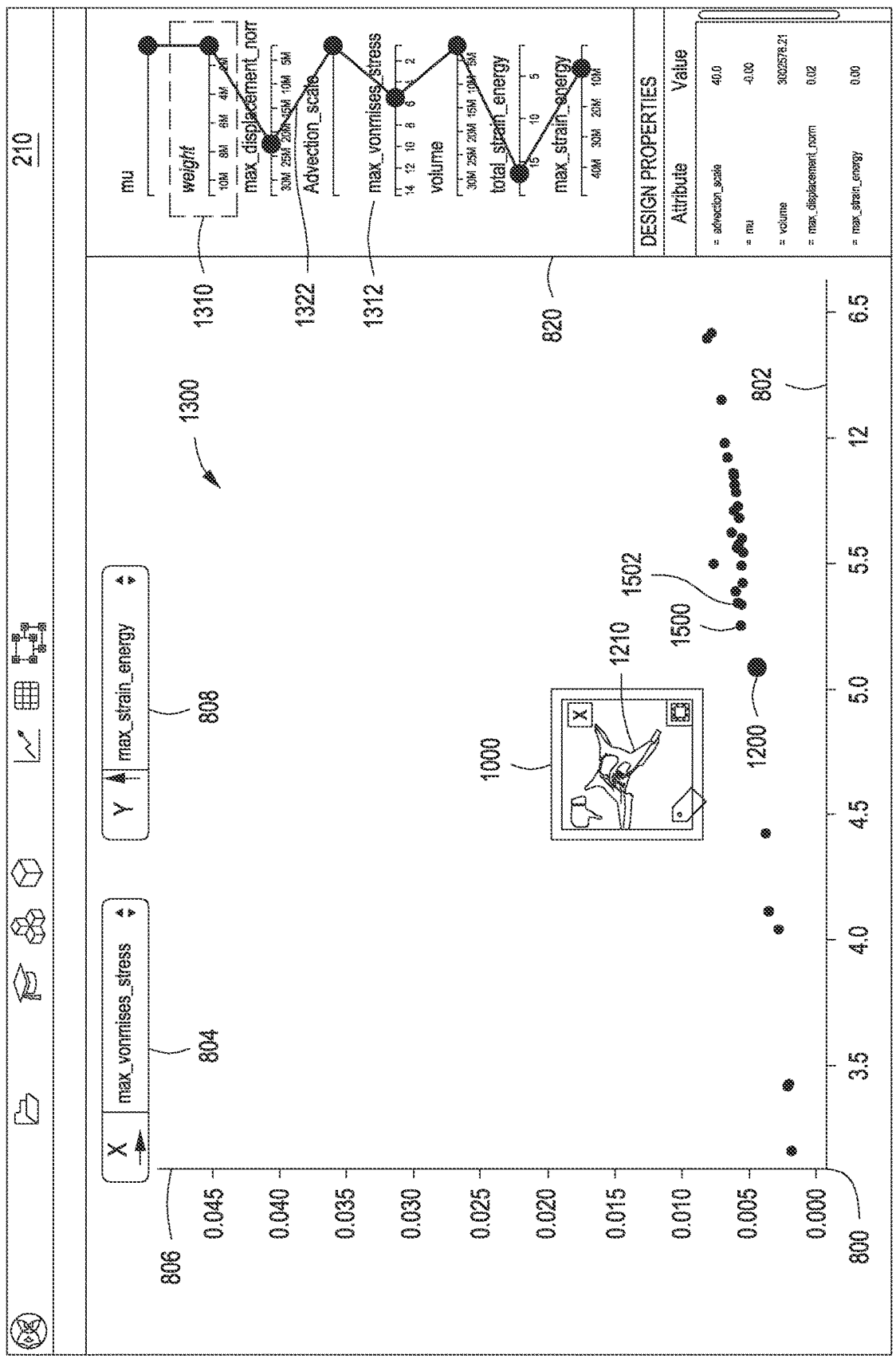
FIG. 15 illustrates how design options are generated based on analyzing a user profile, according to various embodiments of the present invention.

FIG. 15 illustrates how design options are generated based on analyzing a user profile, according to various embodiments of the present invention. As shown, GUI 210 includes, without limitation, suggested design options 1500 and 1502. As the end-user analyzes various design options 206, GUI engine 208 collects statistics related to the types of design options 206 the end-user may find favorable. Then, GUI engine 208 may predict specific design options, such as design options 1500 and 1502, which share similar statistics as the design options 206 viewed by the end-user. In doing so, GUI engine 208 analyzes the user profile to make such predictions.

Figure 16:
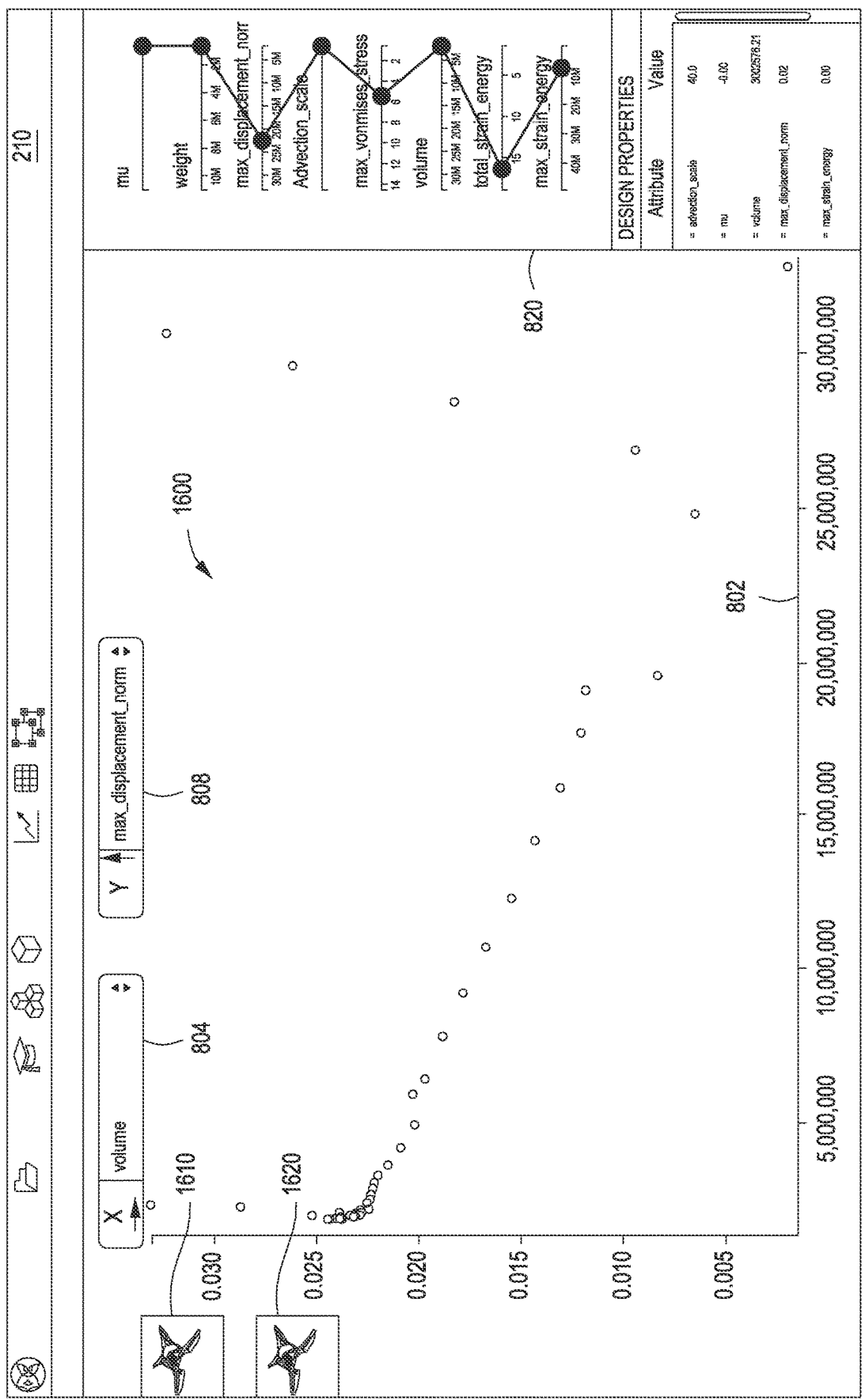
FIG. 16 illustrates how comparative panels are generated to show different design options, according to various embodiments of the present invention.

FIG. 16 illustrates how comparative panels are generated to show different design options, according to various embodiments of the present invention. As shown, GUI 210 includes, within limitation, design option spectrum 1600, comparative panel 1610, and comparative panel 1620. Spectrum 1600 represents a further narrowed version of spectrum 1300. Comparative panel 1610 and 1620 display design options selected by the end-user for comparison. When comparing design options via comparative panels 1610 and 1620 in this manner, GUI engine 208 may display 3D rotatable models of those design options, attributes for each design option, and potentially plot various attributes of those design options against one another for comparative purposes.

Referring generally to FIGS. 8-16, by generating design comparison plot 800 and other elements for comparing design options, GUI engine 208 allows the end-user to evaluate design options based on a wealth of information. Then, the end-user may select a design option 206 based on a great deal more information that possible with prior art approaches. Persons skilled in the art will understand that the various screenshots shown in FIGS. 3-16 are presented for exemplary purposes to illustrate the operation of GUI engine 208 when generating GUI 210. That operation is also described, in stepwise fashion, below in conjunction with FIG. 17.

Figure 17:
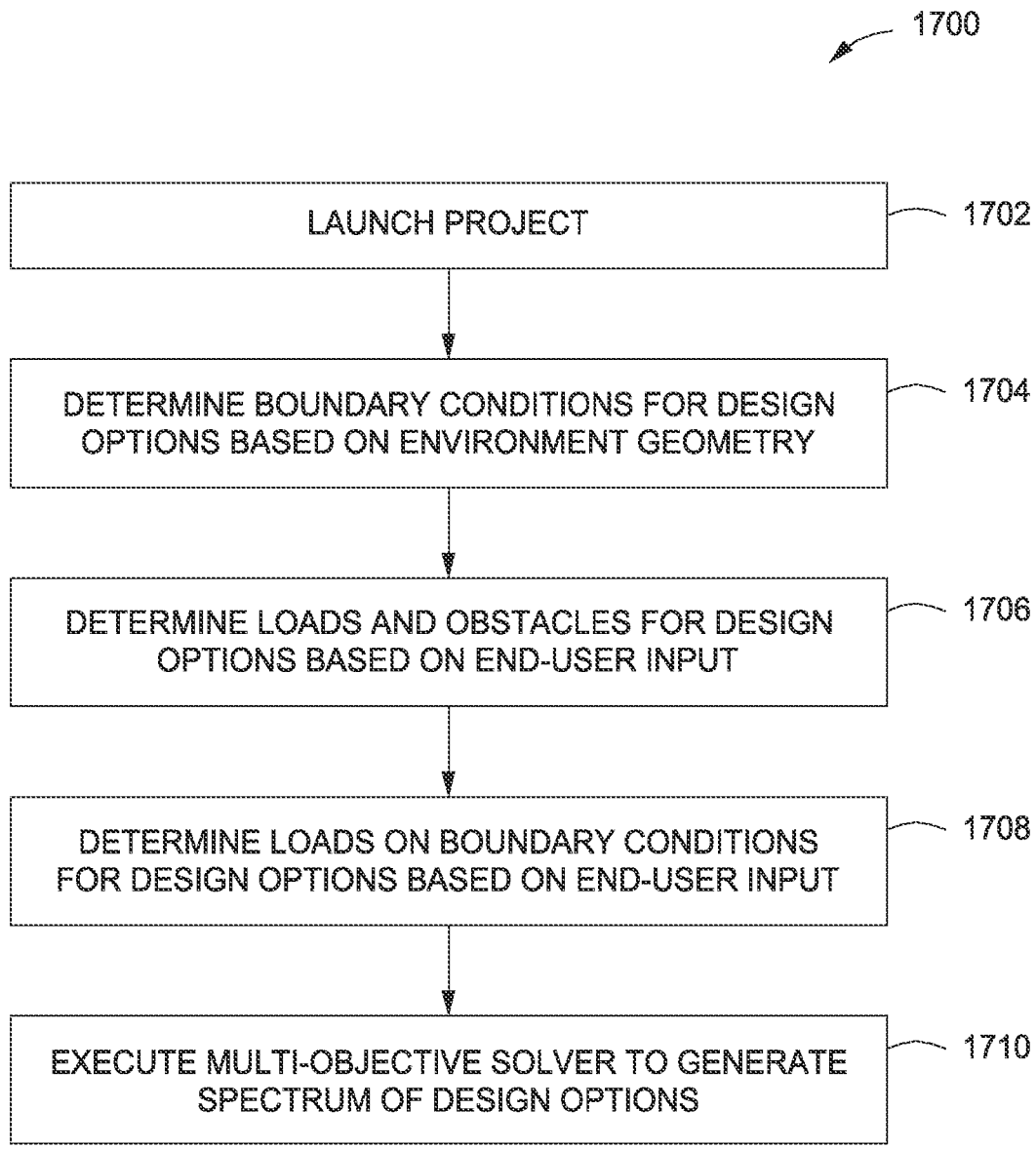
FIG. 17 is a flow diagram of method steps for generating a spectrum of design options that solve a design problem, according to various embodiments of the present invention.

FIG. 17 is a flow diagram of method steps for generating a spectrum of design options that solve a design problem, according to various embodiments of the present invention. Although the method steps are described in conjunction with the systems of FIGS. 1-16, persons skilled in the art will understand that any system configured to perform the method steps, in any order, is within the scope of the present invention.

As shown, a method 1700 begins at step 1702, where GUI engine 208 receives a selection of a design space via a design space selector, and then launches that design space. GUI engine 208 then retrieves data associated with the design space, including a 3D environment that includes geometry associated with the design space. The geometry may be generated within the 3D environment based on interactions with GUI engine 208 and/or setup engine 200 performed via GUI 210, or the geometry may be imported into design application 120 from an external source.

At step 1704, GUI engine 208 determines boundary conditions for design options based on the geometry associated with the design space. The boundary conditions may be derived from the geometry associated with the design space are set by the end-user via interaction with GUI 210.

At step 1706, GUI engine 208 determines one or more loads to be balanced by potential design options and one or more obstacle to be avoided by potential design options. GUI engine 208 may determine the one or more loads based on end-user placement of one or more ports and definition of forces associated with each such port. GUI engine 208 may determine the one or more obstacles based on end-user geometry that describes those obstacles.

At step 1708, GUI engine 208 determines one or more loads on the boundary conditions associated with the design space. As mentioned above, the boundary conditions may be associated with 3D geometry. The end-user may specify forces on that geometry via interaction with GUI 210.

At step 1710, synthesis engine 204 executes a multi-objective solver, based on the design objectives, constraints, and boundary conditions set forth in the design space, to generate a spectrum of design options 206. Each design option in the spectrum generally adheres to the various design criteria associated with the design space. In addition, each design option 206 is associated with a set of simulated physical attributes, such as, for example, weight, maximum strain, volume, maximum shear force, coefficient of drag, displacement, and so forth. The simulated physical attributes for a given design option 206 may be derived via a physical simulation of that design option 206. Once synthesis engine 204 generates the spectrum of design options 206, GUI engine 208 updates GUI 210 to compare those different design options, as described in greater detail below in conjunction with FIG. 18.

Figure 18:
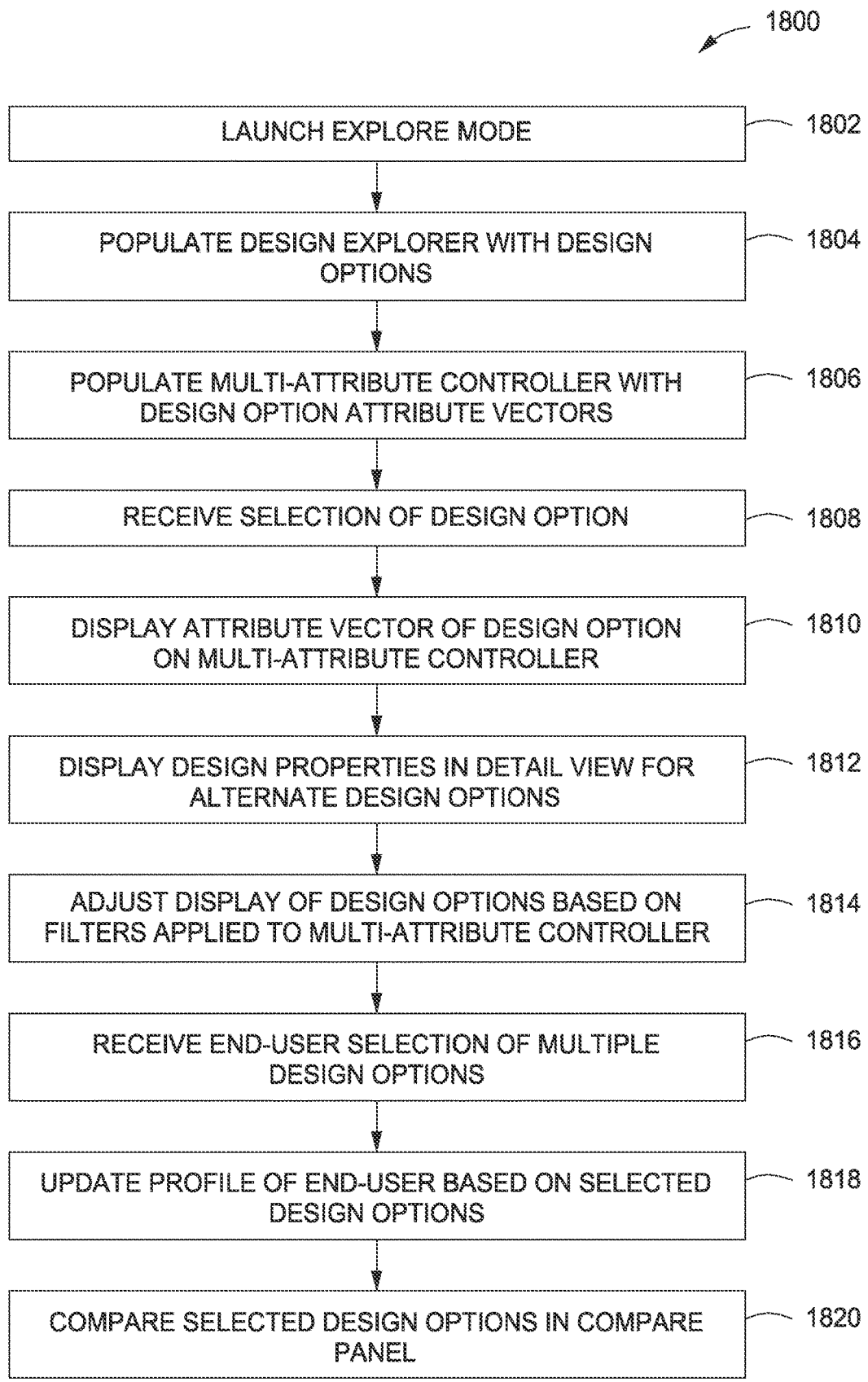
FIG. 18 is a flow diagram of method steps generating comparative panels that show different design options in a spectrum of design options, according to various embodiments of the present invention.

FIG. 18 is a flow diagram of method steps generating comparative panels that show different design options in a spectrum of design options, according to various embodiments of the present invention. Although the method steps are described in conjunction with the systems of FIGS. 1-16, persons skilled in the art will understand that any system configured to perform the method steps, in any order, is within the scope of the present invention.

As shown a method 1800 begins at step 1802, where GUI engine 208 launches explore mode. In doing so, GUI engine 208 generates GUI 210 to include a design comparison plot. The design comparison plot includes an X-axis that corresponds to an X-axis attribute and a Y-axis that corresponds to a Y-axis attribute. GUI engine 208 is configured to adjust the specific attribute associated with each such axis based on end-user input.

At step 1804, GUI engine 208 populates the design comparison plot to include the spectrum of design options generated via the method 1700 described in conjunction with FIG. 17. GUI engine 208 is configured to place each design option 206 within the design comparison plot based on attributes of those design options that correspond to the X-axis attribute and the Y-axis attribute. Specifically, for a given design option 206, GUI engine 208 determines the X and Y-axis attributes of the design comparison plot, and then determines corresponding attributes of the design option 206. Based on the values of those attributes, GUI engine 208 determines an X-Y position for the design option 206 and then updates the design comparison plot to include that design option at the determined X-Y position.

At step 1806, GUI engine 208 populates a multi-attribute controller with one or more design option vectors. The multi-attribute controller includes a set of axes shown specific ranges of attributes. Each design option vector is a vector of attribute values associated with a specific design option 206. Those attributes could include, for example, weight, volume, maximum stress, maximum strain, total strain energy, maximum von Mises stress, and other physical attributes of a design. GUI engine 208 populates the multi-attribute controller with a collection of design option vectors or a design option hyper-vector generated based on multiple design option vectors.

At step 1808, GUI engine 208 receives a selection of a design option. At step 1810, GUI engine 208 displays a design option vector for that design option on the multi-attribute controller. The multi-attribute controller shows the specific attribute values of the design option on the various axes of the multi-attribute controller corresponding to those attributes.

At step 1812, GUI engine 208 displays design properties for alternate design options in a detail view window. GUI engine 208 may display design properties for a range of alternate design options, including the design option selected at step 1808.

At step 1814, GUI engine 208 adjusts the design comparison plot to display different design options based on attribute filter settings applied to the multi-attribute controller. The multi-attribute controller includes attribute sliders that allow the end-user to constrain specific attributes of design options 206. Based on the position of these sliders, GUI engine 208 may hide or show certain design options 206 in the spectrum when plotting design comparison plot.

At step 1816, GUI engine 208 receives end-user selection of multiple design options 206. At step 1818 GUI engine 208 updates a profile associated with end-user to reflect statistical preferences associated with that end-user. GUI engine 208 may collect statistics related to the types of design options 206 the end-user finds favorable. Then, GUI engine 208 may predict specific design options that share similar statistics as the design options 206 viewed by the end-user.

At step 1820, GUI engine analyzes the selected design options and generates comparative panels that include those design options. When displaying the selected design options in this manner, GUI engine 208 may display images of those design options, attributes for each design option, and potentially plot various attributes of those design options against one another for comparative purposes.

In sum, a design application allows an end-user to define an engineering problem, and then synthesizes a spectrum of design options that solve the engineering problem. The design application then generates various tools to allow the end-user to explore that spectrum of design options. The design application allows the end-user to compare various attributes of each design option, and to filter the spectrum of design options based on those attributes. In response to end-user selections of certain design options, the design application identifies other similar design options, and then displays these design options to the end-user.

At least one advantage of the disclosed techniques is that an end-user can evaluate the entire spectrum of design options and narrow that spectrum until only a handful of feasible design options remain. Thus, the end-user need not generate and evaluate every possible design option independently. Further, when evaluating tradeoffs between highly similar design options, the design application generates design option vectors for each such design that highlight differences between those designs.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The invention claimed is:

1. One or more non-transitory computer-readable media storing instructions that, when executed by one or more processors, cause the one or more processors to generate design options for comparison by:
  generating a spectrum of design options, wherein each design option included in the spectrum of design options is associated with a first attribute;
  generating a design comparison graph that includes a first graph axis corresponding to possible values for the first attribute;
  generating a multi-attribute controller that includes a set of axes corresponding to a set of attributes associated with the spectrum of design options;
  determining, based on an input received via the multi-attribute controller, a first attribute value on a first axis in the set of axes, wherein the first attribute value is associated with a first design option included in the spectrum of design options;
  determining, based on the first attribute value, a first position along the first graph axis; and
  displaying, at the first position, a first indicator for the first design option, wherein at least a second indicator associated with a second design option included in the spectrum of design options is displayed at a second position along the first graph axis.

2. The one or more non-transitory computer-readable media of claim 1, wherein the step of generating the spectrum of design options comprises:
  determining at least one design criterion associated with a design problem; and
  generating at least one design option that satisfies the at least one design criterion.

3. The one or more non-transitory computer-readable media of claim 2, wherein the at least one design criterion comprises at least one: of a design objective, a design constraint, a geometrical constraint, or a boundary condition.

4. The one or more non-transitory computer-readable media of claim 1, wherein the design comparison graph further includes a second graph axis corresponding to possible values for a second attribute with which the spectrum of design options is associated, and further comprising:
  determining, based on the input received via the multi-attribute controller, a second attribute value on a second axes in the set of axes, wherein the second attribute value is associated with the first design option,
  determining, based on the second attribute value, a third position along the second graph axis; and
  displaying, at the third position, the first indicator.

5. The one or more non-transitory computer-readable media of claim 1, further comprising:
  configuring the design comparison graph so that the first graph axis also corresponds to a second attribute with which the spectrum of design options is associated;
  determining, based on the input received via the multi-attribute controller, a second attribute value on a second axes in the set of axes, wherein the second attribute value is associated with the first design option,
  determining, based on the second attribute value, a third position along the first graph axis; and
  displaying, at the third position, the first indicator.

6. The one or more non-transitory computer-readable media of claim 1, further comprising:
  generating a first design option vector that represents the first design option, wherein the first design option vector indicates the first attribute value on the first axis; and
  displaying the first design option vector on the multi-attribute controller.

7. The one or more non-transitory computer-readable media of claim 6, further comprising:
  generating, based on both the first design option vector and at least one other design option vector, a design option hyper-vector; and
  displaying the design option hyper-vector on the multi-attribute controller.

8. The one or more non-transitory computer-readable media of claim 6, further comprising:
  determining that a first attribute range is applied to the first axis;
  determining that the first attribute value is not included within the first attribute range;
  removing the first design option from the design comparison graph; and
  removing the first design option vector from the multi-attribute controller.

9. The one or more non-transitory computer-readable media of claim 1, further comprising:
  determining that the first design option has been selected; and
  displaying a first detailed view associated with the first design option in a first window separate from the first indicator, the detailed view including:
    a first image of geometry associated with the first design option; and
    a first set of design properties associated with the first design option.

10. The one or more non-transitory computer-readable media of claim 9, further comprising:
  identifying, based on analyzing the first design option, the second design option; and
  displaying a second detailed view associated with the second design option in a second window separate from the second indicator, the second detailed view including
    a second image of geometry associated with the second design option; and
    a second set of design properties associated with the second design option.

11. The one or more non-transitory computer-readable media of claim 10, wherein the second design option is identified via a profile that indicates statistical preferences of an end-user.

12. The one or more non-transitory computer-readable media of claim 9, further comprising:
  determining that the second design option has been selected; and
  displaying, in conjunction with displaying the first detailed view associated with the first design option, a second detailed view associated with the second design option in a second window separate from the second indicator.

13. A computer-implemented method for generating design options for comparison, the method comprising:
  generating a spectrum of design options, wherein each design option included in the spectrum of design options is associated with a first attribute;
  generating a design comparison graph that includes a first graph axis corresponding to possible values for the first attribute;
  generating a multi-attribute controller that includes a set of axes corresponding to a set of attributes associated with the spectrum of design options;
  determining, based on an input received via the multi-attribute controller, a first attribute value on a first axis in the set of axes, wherein the first attribute value is associated with a first design option included in the spectrum of design options;

determining, based on the first attribute value, a first position along the first graph axis; and displaying, at the first position, a first indicator for the first design option, wherein at least a second indicator associated with a second design option included in the spectrum of design options is displayed at a second position along the first graph axis.

14. The computer-implemented method of claim 13, wherein the step of generating the spectrum of design options comprises:

determining at least one design criterion associated with a design problem; and generating at least one design option that satisfies the at least one design criterion.

15. The computer-implemented method of claim 14, wherein the at least one design criterion comprises at least one of: a design objective, a design constraint, a geometrical constraint, or a boundary condition.

16. The computer-implemented method of claim 13, wherein the design comparison graph further includes a second graph axis corresponding to possible values for a second attribute with which the spectrum of design options is associated, and further comprising:

determining, based on the input received via the multi-attribute controller, a second attribute value on a second axes in the set of axes, wherein the second attribute value is associated with the first design option, determining, based on the second attribute value, a third position along the second graph axis; and displaying, at the third position, the first indicator.

17. The computer-implemented method of claim 13, further comprising:

configuring the design comparison graph so that the first graph axis also corresponds to a second attribute with which the spectrum of design options is associated;

determining, based on the input received via the multi-attribute controller, a second attribute value on a second axes in the set of axes, wherein the second attribute value is associated with the first design option, determining, based on the second attribute value, a third position along the first graph axis; and displaying, at the third position, the first indicator.

18. The computer-implemented method of claim 13, further comprising:

generating a first design option vector that represents the first design option, wherein the first design option vector indicates the first attribute value on the first axis; and displaying the first design option vector on the multi-attribute controller.

19. The computer-implemented method of claim 18, further comprising:

generating, based on both the first design option vector and at least one other design option vector, a design option hyper-vector; and displaying the design option hyper-vector on the multi-attribute controller.

20. The computer-implemented method of claim 18, further comprising:

determining that a first attribute range is applied to the first axis;

determining that the first attribute value is not included within the first attribute range;

removing the first design option from the design comparison graph; and removing the first design option vector from the multi-attribute controller.

21. The computer-implemented method of claim 13, further comprising:

determining that the first design option has been selected; and displaying a first detailed view associated with the first design option in a first window separate from the first indicator, the detailed view including:

a first image of geometry associated with the first design option; and a first set of design properties associated with the first design option.

22. The computer-implemented method of claim 21, further comprising:

identifying, based on analyzing the first design option, the second design option; and displaying a second detailed view associated with the second design option in a second window separate from the second indicator, the second detailed view including a second image of geometry associated with the second design option; and a second set of design properties associated with the second design option.

23. A system for generating design options for comparison, comprising:

a memory storing a design application; and a processor that executes the design application to:

generate a spectrum of design options, wherein each design option included in the spectrum of design options is associated with a first attribute, generate a design comparison graph that includes a first graph axis corresponding to possible values for the first attribute, generate a multi-attribute controller that includes a set of axes corresponding to a set of attributes associated with the spectrum of design options;

determine, based on an input received via the multi-attribute controller, a first attribute value one a first axis in the set of axes, wherein the first attribute value is associated with a first design option included in the spectrum of design options, determine, based on the first attribute value, a first position along the first axis, and display, at the first position, a first indicator for the first design option, wherein at least a second indicator associated with a second design option included in the spectrum of design options is displayed at a second position along the first graph axis.

24. The system of claim 23, wherein the design comparison graph further includes a second graph axis corresponding to possible values for a second attribute with which the spectrum of design options is associated, and wherein the processor further executes the design application to:

determine, based on the input received via the multi-attribute controller, a second attribute value on a second axes in the set of axes, wherein the second attribute value is associated with the first design option, determine, based on the second attribute value, a third position along the second graph axis; and display, at the third position, the first indicator.

* * * * *